US011233186B2

(12) United States Patent
Miyazaki et al.

(10) Patent No.: US 11,233,186 B2
(45) Date of Patent: Jan. 25, 2022

(54) SEMICONDUCTOR LIGHT-EMITTING DEVICE

(71) Applicant: ROHM CO., LTD., Kyoto (JP)

(72) Inventors: Dai Miyazaki, Kyoto (JP); Masahiko Kobayakawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 7 days.

(21) Appl. No.: 16/939,537

(22) Filed: Jul. 27, 2020

(65) Prior Publication Data
US 2021/0043818 A1 Feb. 11, 2021

(30) Foreign Application Priority Data

Aug. 5, 2019 (JP) .............................. JP2019-143493

(51) Int. Cl.
H01L 33/62 (2010.01)
H01L 33/52 (2010.01)

(52) U.S. Cl.
CPC .............. H01L 33/62 (2013.01); H01L 33/52 (2013.01); H01L 2224/48247 (2013.01)

(58) Field of Classification Search
CPC ..................... H01L 33/62; H01L 33/52; H01L 2224/48247; H01L 25/167; H01L 33/486; H01L 2933/0066
See application file for complete search history.

(56) References Cited

U.S. PATENT DOCUMENTS

| 8,097,937 B2* | 1/2012 | Bogner | H01L 33/62 257/676 |
| 2007/0269927 A1* | 11/2007 | Hofer | B29C 45/1671 438/106 |
| 2008/0237627 A1* | 10/2008 | Kobayakawa | H01L 33/486 257/99 |
| 2010/0148211 A1* | 6/2010 | Sheu | H01L 33/486 257/99 |
| 2011/0215349 A1* | 9/2011 | An | H01L 33/486 257/89 |
| 2012/0134178 A1* | 5/2012 | Park | H01L 33/486 362/609 |
| 2012/0211789 A1* | 8/2012 | Lee | H01L 33/486 257/98 |

(Continued)

FOREIGN PATENT DOCUMENTS

CN 10756310 A * 1/2018 ............... 33/48
JP 2018-125372 A 8/2018

Primary Examiner — Victor A Mandala
(74) Attorney, Agent, or Firm — Hamre, Schumann, Mueller & Larson, P.C.

(57) ABSTRACT

There is provided a semiconductor light-emitting device including: a main lead including a main surface; a semiconductor light-emitting element mounted on the main surface of the main lead; a bonding material that bonds the semiconductor light-emitting element to the main surface of the main lead; a sub lead arranged in a first direction with respect to the main lead and including a main surface facing the same side as the main surface of the main lead; a first wire including a first end connected to the main surface of the sub lead and a second end connected to the semiconductor light-emitting element; a resin case including a case main surface facing the same direction as the main surfaces of the main lead and the sub lead and supporting the main lead and the sub lead.

20 Claims, 22 Drawing Sheets

(56) References Cited

U.S. PATENT DOCUMENTS

2014/0110745 A1\* 4/2014 Lee ................. H01L 27/32
                                                  257/99
2017/0170366 A1\* 6/2017 Fukuda ............ H01L 23/49575

\* cited by examiner

SEMICONDUCTOR LIGHT-EMITTING DEVICE

CROSS-REFERENCE TO RELATED APPLICATION

This application is based upon and claims the benefit of priority from Japanese Patent Application No. 2019-143493, filed on Aug. 5, 2019, the entire contents of which are incorporated herein by reference.

TECHNICAL FIELD

The present disclosure relates to a semiconductor light-emitting device.

BACKGROUND

A conventional semiconductor light-emitting device includes a semiconductor light-emitting element, leads, and a resin case.

By the way, the semiconductor light-emitting element is bonded to the leads using a bonding material. If the bonding material spreads excessively from a desired portion of the leads, the connectivity of wires connecting the semiconductor light-emitting element to the leads may be deteriorated.

SUMMARY

Some embodiments of the present disclosure provide a semiconductor light-emitting device capable of suppressing the spread of a bonding material.

According to one embodiment of the present disclosure, there is provided a semiconductor light-emitting device including: a main lead including a main surface; a semiconductor light-emitting element mounted on the main surface of the main lead; a bonding material that bonds the semiconductor light-emitting element to the main surface of the main lead; a sub lead arranged in a first direction with respect to the main lead and including a main surface facing the same side as the main surface of the main lead; a first wire including a first end connected to the main surface of the sub lead and a second end connected to the semiconductor light-emitting element; a resin case including a case main surface facing the same direction as the main surfaces of the main lead and the sub lead and supporting the main lead and the sub lead, wherein the resin case includes: a main opening that is partitioned by a main inner side surface facing the semiconductor light-emitting element and exposes a portion of the main surface of the main lead and the semiconductor light-emitting element; a sub opening that extends in the first direction from a first main inner side surface of the main inner side surface facing an opposite side of the sub lead and exposes a portion of the main surface of the sub lead and the first end of the first wire; and a wall portion that is arranged between the main lead and the sub lead, extends along a second direction orthogonal to the first direction and parallel to the main surface of the main lead, protrudes from the main surface of the main lead and the main surface of the sub lead toward the case main surface side, and includes an upper surface located between the case main surface and the main surfaces of the main lead and the sub lead, and wherein the first main inner side surface extends from the upper surface of the wall portion to the case main surface of the resin case.

With this configuration, many bonding materials are used for bonding a semiconductor light-emitting element having a large area. In the die bonding process, the bonding material may flow out from the die bonding portion. In the wall portion, the bonding material flowing out from the main lead is blocked by the wall portion and does not flow into the sub lead. Accordingly, the bonding material is prevented from flowing into the sub lead.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
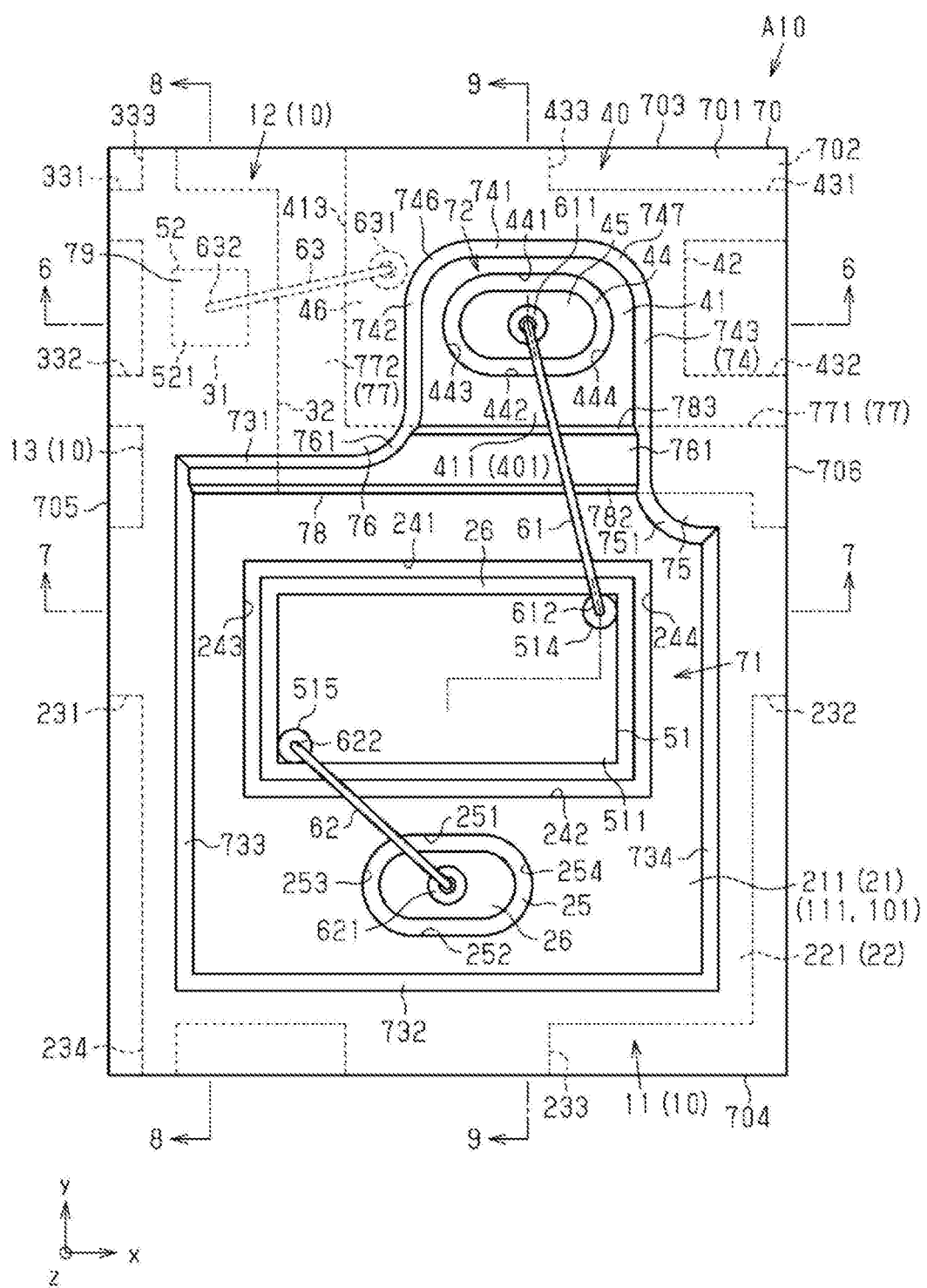
FIG. 1 is a schematic plan view of a semiconductor light-emitting device according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments and modifications of the present disclosure will be now described in detail with reference to the drawings. The following embodiments and modifications exemplify a configuration and method for embodying the technical idea of the present disclosure, and do not limit the material, shape, structure, arrangement, dimension, etc. of each constituent part of the present disclosure. The following embodiments and modifications can be changed in various ways. Further, the following embodiments and modifications can be implemented in combination unless technically contradictory.

First Embodiment

Hereinafter, a semiconductor light-emitting device according to a first embodiment will be described with reference to FIGS. 1 to 16. As shown in FIGS. 1 to 8, the semiconductor light-emitting device A10 according to the first embodiment includes a main lead 10, a sub lead 40, a semiconductor light-emitting element 51, a protective element 52, wires 61, 62 and 63, a case 70, and a sealing member 90. The sealing member 90 is omitted in the drawings other than FIG. 3.

The semiconductor light-emitting device A10 has a rectangular parallelepiped shape. The semiconductor light-emitting device A10 has a length of, for example, 2.7 mm, a width of, for example, 2.0 mm, and a thickness of, for example, 0.6 mm, and is configured as a thin semiconductor light-emitting device. Here, for convenience of description, a longitudinal direction of the semiconductor light-emitting device A10 orthogonal to the thickness direction z of the semiconductor light-emitting device A10 is defined as a first direction y, and a lateral direction of the semiconductor light-emitting device orthogonal to the thickness direction z and the first direction y is defined as a second direction x.

Figure 2:
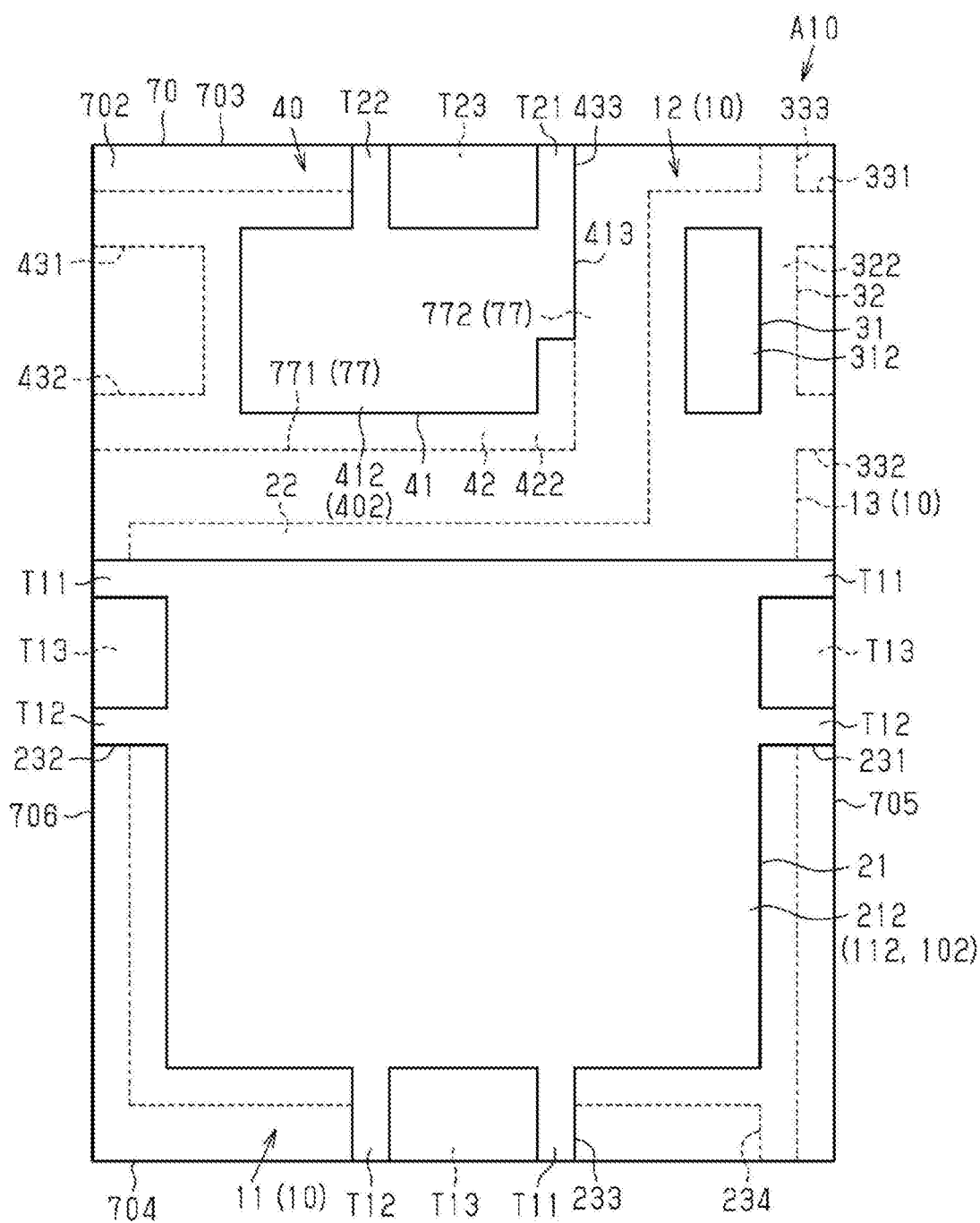
FIG. 2 is a schematic bottom view of the semiconductor light-emitting device according to the first embodiment.

As shown in FIGS. 1 and 2, the main lead 10 and the sub lead 40 are arranged in the first direction y. The main lead 10 and the sub lead 40 support the semiconductor light-emitting element 51 and the protective element 52. The protective element 52 is, for example, a Zener diode. The main lead 10 and the sub lead 40 are provided to supply electric power to the semiconductor light-emitting element 51. The main lead 10 is composed of, for example, a base material made of copper (Cu), nickel (Ni), or an alloy containing at least one selected from the group thereof, and a plating layer on the surface of the base material. The plating layer is composed of at least one layer such as a Ni plating layer, a gold (Au)-palladium (Pd) plating layer, a silver (Ag) plating layer, and the like. The sub lead 40 includes a base material made of, for example, Cu, Ni, or an alloy containing at least one selected from the group thereof, and a plating layer on the surface of the base material. The plating layer is composed of at least one layer such as a Ni plating layer, an Au—Pd plating layer, an Ag plating layer, and the like.

The case 70 has a rectangular shape as a whole. The case 70 supports the main lead 10 and the sub lead 40. The case 70 includes a case main surface 701, a case back surface 702, and case outer side surfaces 703, 704, 705 and 706. The case main surface 701 and the case back surface 702 face opposite sides in the thickness direction z. The case outer side surface 703 and the case outer side surface 704 face opposite sides in the first direction y. The case outer side surface 705 and the case outer side surface 706 face opposite sides in the second direction x.

The main lead 10 has a first element mounting portion 11, a second element mounting portion 12, and a connecting portion 13. The first element mounting portion 11 is a portion on which the semiconductor light-emitting element 51 is mounted. The second element mounting portion 12 is a portion on which the protective element 52 is mounted. The connecting portion 13 is a portion that connects the second element mounting portion 12 to the first element mounting portion 11.

Figure 3:
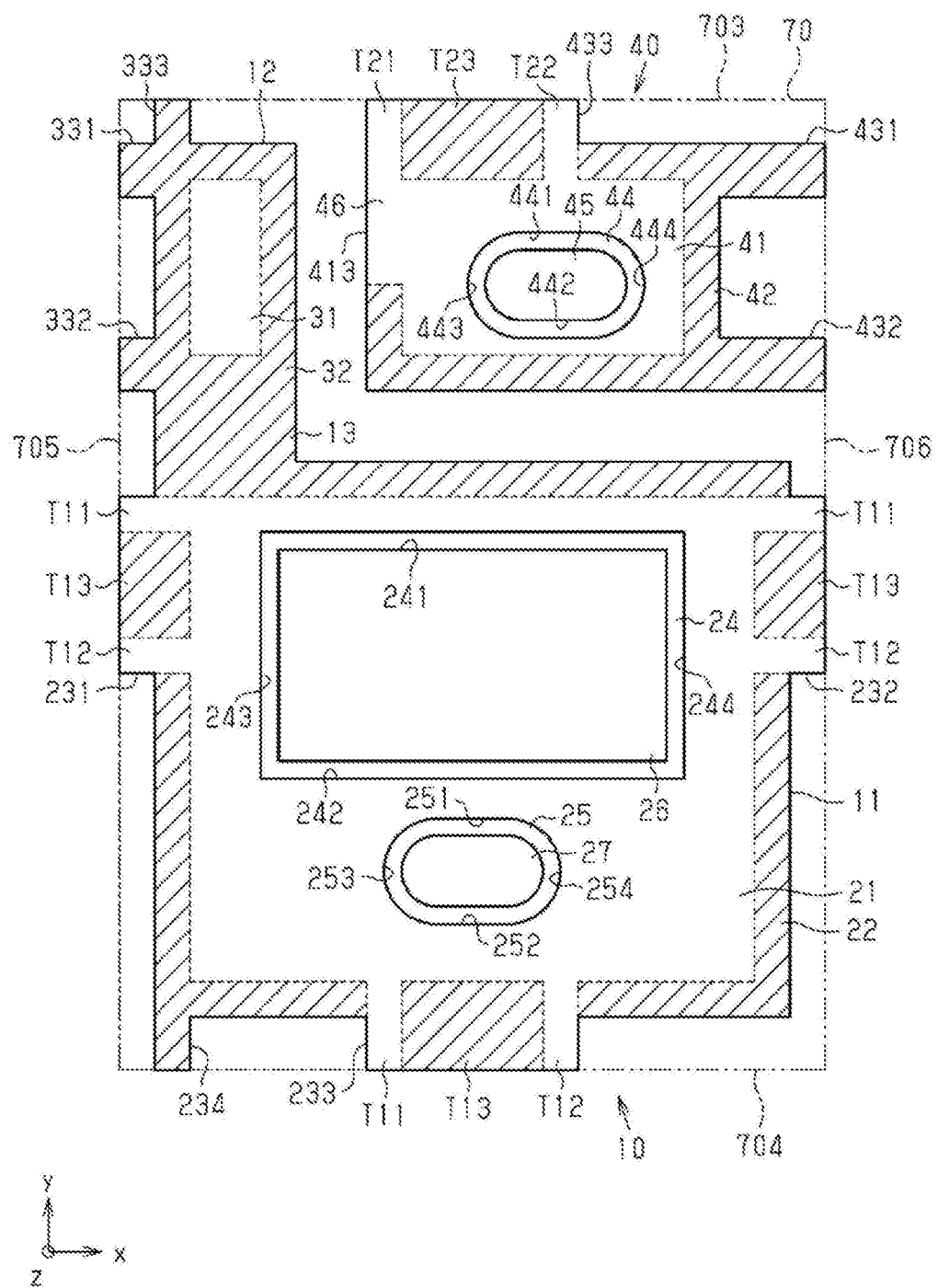
FIG. 3 is a plan view of a main lead and a sub lead according to the first embodiment.

The first element mounting portion 11 is provided on one end side of the semiconductor light-emitting device A10 in the first direction y, on the lower side of FIGS. 1, 2, and 3. The second element mounting portion 12 is disposed in a direction from the first element mounting portion 11 toward the first direction y, and is connected to the first element mounting portion 11 via the connecting portion 13. In other words, the connecting portion 13 and the second element mounting portion 12 are arranged in this order from the first element mounting portion 11 along the first direction y. The second element mounting portion 12 is arranged side by side with the sub lead 40 in the second direction x. That is, the second element mounting portion 12 is disposed on one end side (the left side in FIG. 1) of the semiconductor light-emitting device A10 in the second direction x, and the sub lead 40 is disposed on the other end side (the right side in FIG. 1) of the semiconductor light-emitting device A10 in the second direction x.

Figure 5:
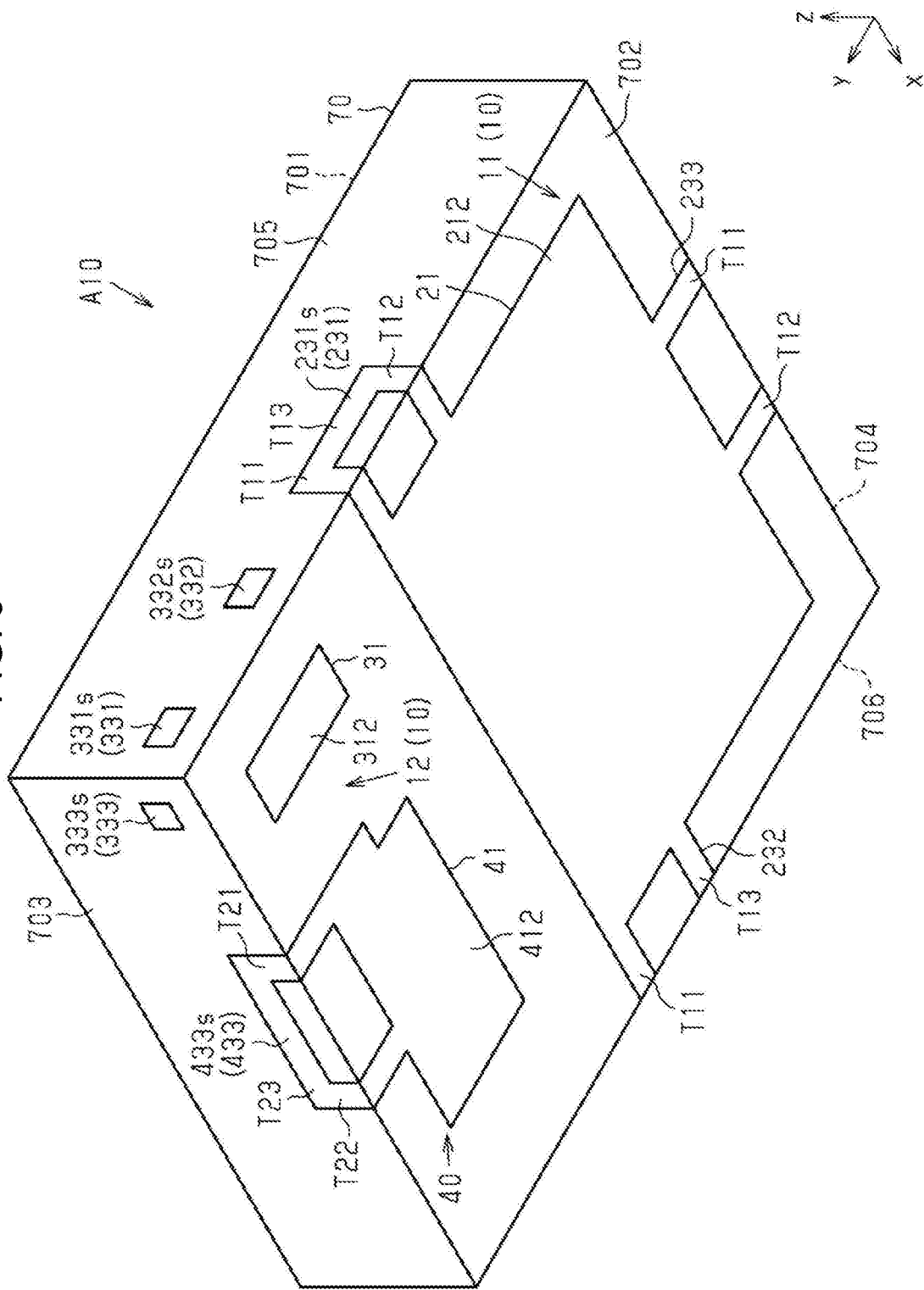
FIG. 5 is a schematic perspective view of the semiconductor light-emitting device according to the first embodiment when viewed from the back side thereof.

As shown in FIGS. 1, 2, and 3, the first element mounting portion 11 includes a main body portion 21, an edge portion 22, and extension portions 231, 232, 233, and 234. The main body portion 21 has a quadrangular shape when viewed from the thickness direction z. The main body portion 21 includes a main surface 211 and a back surface 212 facing opposite sides in the thickness direction z. The thickness of the main body portion 21 is, for example, about 0.2 mm. As shown in FIGS. 2 and 5, the back surface 212 of the main body portion 21 is flush with the case back surface 702 of the case 70 and is exposed from the case back surface 702.

The main body portion 21 includes grooves 24 and 25 that are recessed from the main surface 211 toward the back surface 212. In the first embodiment, the grooves 24 and 25 are arranged along the first direction y. Further, the grooves 24 and 25 are arranged at the center of the main body portion 21 in the second direction x.

The groove 24 includes groove portions 241 and 242 extending in the second direction x, and groove portions 243 and 244 extending in the first direction y. The groove portions 243 and 244 connect the ends of the groove portions 241 and 242 in the second direction x to communicate with each other. The groove 24 is formed in a rectangular ring shape when viewed from the thickness direction. The depth of the groove 24 is, for example, about 50 μm.

The groove 25 includes groove portions 251 and 252 extending in the second direction x, and groove portions 253 and 254 having a semi-annular shape. The groove portions 253 and 254 connect the end portions of the groove portions 251 and 252 in the second direction x to communicate with each other. The groove 25 is formed in an elliptical annular shape that bulges in a semicircular shape on both sides in the width direction when viewed from the thickness direction z. The depth of the groove 25 is, for example, about 50 µm.

In the first embodiment, the inside of the annular groove 24 is a die bonding portion 26, and the inside of the annular groove 25 is a wire bonding portion 27. That is, the main lead 10 of the first embodiment includes the die bonding portion 26 and the wire bonding portion 27, which are surrounded by the grooves 24 and 25.

Figure 8:
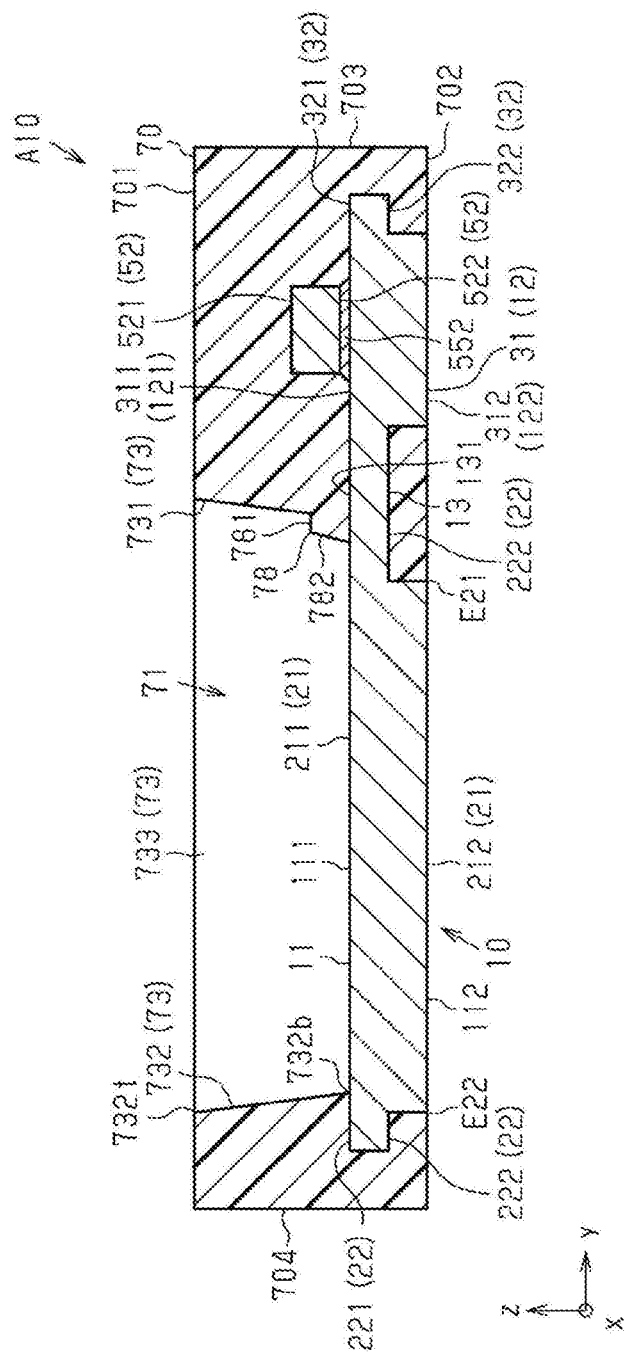
FIG. 8 is a cross-sectional view taken along line 8-8 in FIG. 1.

As shown in FIGS. 2 and 3, the edge portion 22 is formed along the periphery of the main body portion 21. That is, the edge portion 22 is formed on both sides of the main body portion 21 in the first direction y and in the second direction x. As shown in FIG. 8, the edge portion 22 is a portion thinner than the main body portion 21. The thickness of the edge portion 22 is, for example, about 0.1 mm. A main surface 221 of the edge portion 22 is at the same position as the main surface 211 of the main body portion 21 in the thickness direction z. A back surface 222 of the edge portion 22 is located closer to the main surface 211 of the body portion 21 than the back surface 212 of the main body portion 21. That is, the edge portion 22 is not exposed from the case back surface 702 of the case 70.

As shown in FIGS. 2 and 3, the extension portions 231, 232, and 233 extend from the main body portion 21 to the outside of the edge portion 22. The extension portion 234 extends outward from the edge portion 22. The extension portions 231 and 232 extend in opposite directions from the end portions on both sides of the main body portion 21 in the second direction x. The extension portions 231 and 232 are arranged at positions overlapping with each other in the second direction x. The extension portion 233 extends along the first direction y from the end portion of the main body portion 21 opposite to the sub lead 40. The extension portion 233 is disposed at the center of the main body portion 21 in the second direction x.

Each of the extension portions 231, 232, and 233 includes two thick portions T11 and T12 and a thin portion T13 between the thick portions T11 and T12. In the extension portions 231 and 232, the thick portions T11 and T12 are arranged along the first direction y. In the extension portion 233, the thick portions T11 and T12 are arranged along the second direction x. For example, the thicknesses of the thick portions T11 and T12 are equal to the thickness of the main body portion 21, and the thickness of the thin portion T13 is equal to the thickness of the edge portion 22. The thicknesses of the thick portions T11 and T12 and the thin portion T13 may be changed as appropriate.

Figure 4:
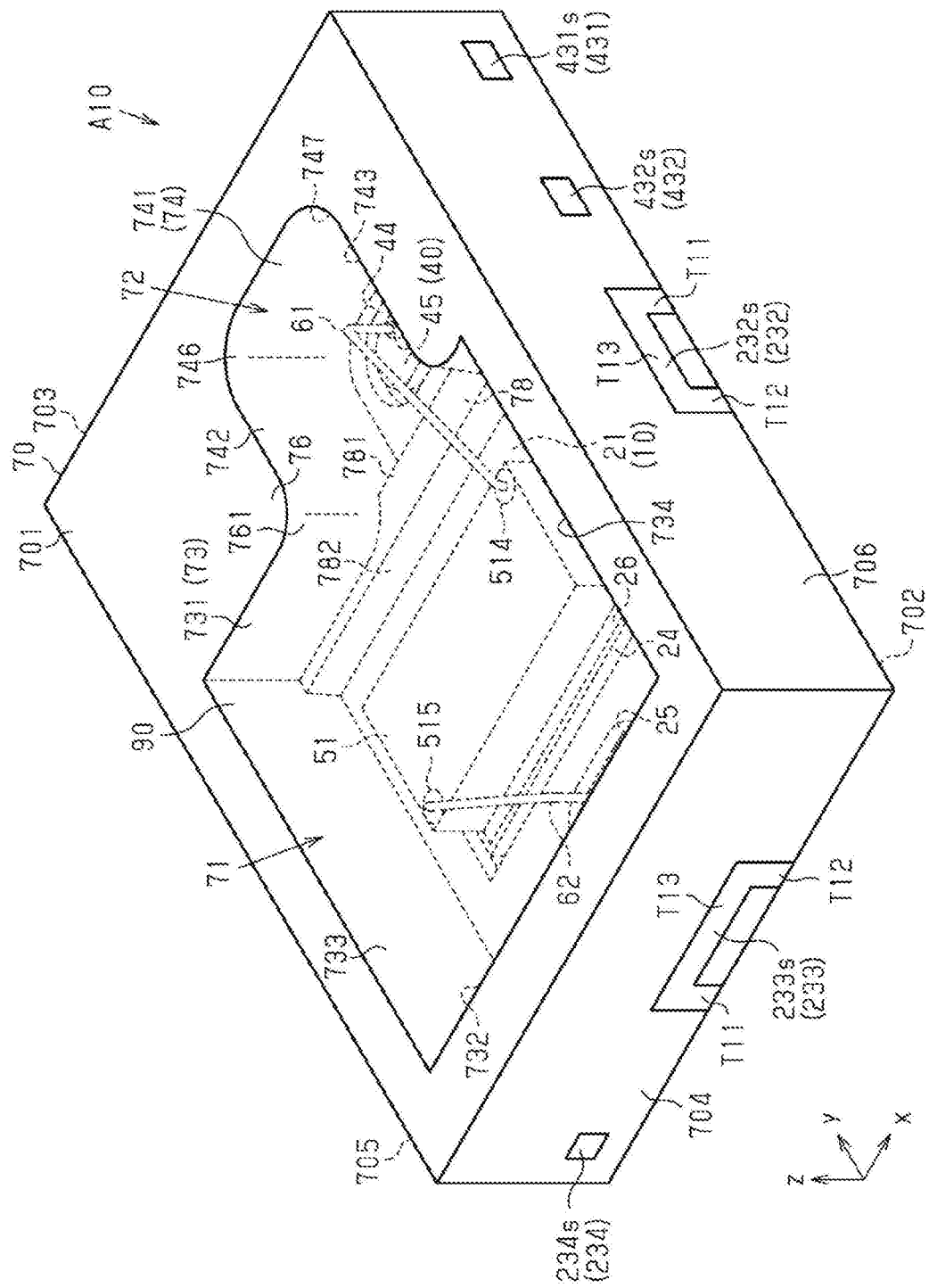
FIG. 4 is a schematic perspective view of the semiconductor light-emitting device according to the first embodiment when viewed from the top surface side thereof.

As shown in FIG. 5, the end surface 231s of the extension portion 231 is exposed from the case outer side surface 705 of the case 70. As shown in FIG. 4, the end surface 232s of the extension portion 232 is exposed from the case outer side surface 706 of the case 70. As shown in FIG. 4, the end surface 233s of the extension portion 233 is exposed from the case outer side surface 704 of the case 70. As shown in FIG. 5, the thick portions T11 and T12 of the extension portions 231, 232, and 233 are exposed from the case back surface 702 of the case 70. The base material of the main lead 10 is exposed on each of the end surfaces 231s, 232s, and 233s. Note that a plating layer may be formed on the end surfaces 231s, 232s, and 233s of the extension portions 231, 232, and 233.

As shown in FIGS. 2 and 3, the extension portion 234 extends from the end portion of the edge portion 22 opposite to the sub lead 40. The extension portion 234 is disposed on the case outer side surface 705 side of the case 70. As shown in FIG. 4, the end surface 234s of the extension portion 234 is exposed from the case outer side surface 704 of the case 70. In the first embodiment, the thickness of the extension portion 234 is equal to the thickness of the edge portion 22. Note that the thickness of the extension portion 234 may be changed as appropriate. The base material of the main lead 10 is exposed on the end surface 234s. Note that a plating layer may be formed on the end surface 234s of the extension portion 234.

As shown in FIGS. 2 and 3, the second element mounting portion 12 has a main body portion 31, an edge portion 32, and extension portions 331, 332, and 333. The main body portion 31 of the second element mounting portion 12 includes a main surface 311 and a back surface 312. The main body portion 31 has a long rectangular shape along the second direction x when viewed from the thickness direction z. The thickness of the main body portion 31 is equal to the thickness of the main body portion 21 of the first element mounting portion 11. As shown in FIGS. 2 and 5, the back surface 312 of the main body portion 31 is flush with the case back surface 702 of the case 70, and is exposed from the case back surface 702.

The edge portion 32 is formed so as to surround the main body portion 31. That is, the edge portion 32 is formed on both sides of the main body portion 31 in the first direction y and the second direction x. The edge portion 32 is formed such that the main surface 321 is flush with the main surface 311 of the main body portion 31. The thickness of the edge portion 32 is smaller than the thickness of the main body portion 31 and is, for example, about 0.1 mm. Therefore, the edge portion 32 is not exposed from the case back surface 702.

The extension portions 331 and 332 extend from the end portion of the edge portion 32 opposite to the sub lead 40 to the case outer side surface 705. The extension portions 331 and 332 are arranged along the first direction y. As shown in FIG. 5, the end surfaces 331s and 332s of the extension portions 331 and 332 are flush with the case outer side surface 705 and are exposed from the case outer side surface 705. The base material of the main lead 10 is exposed on each of the end surfaces 331s and 332s. Note that a plating layer may be formed on the end surfaces 331s and 332s of the extension portions 331 and 332.

As shown in FIGS. 2 and 3, the extension portion 333 extends from the end portion of the edge portion 32 on the case outer side surface 703 side of the case 70 to the case outer side surface 703. The extension portion 333 is provided on the case outer side surface 705 side in the end portion of the edge portion 32. As shown in FIG. 4, the end surface 333s of the extension portion 333 is flush with the case outer side surface 703 and is exposed from the case outer side surface 703. As shown in FIGS. 2 and 3, the extension portion 333 is provided at a position overlapping the extension portion 234 of the first element mounting portion 11 when viewed in the first direction y. The base material of the main lead 10 is exposed on the end surface 333s. Note that a plating layer may be formed on the end surface 333s of the extension portion 333.

As shown in FIGS. 1, 2, and 3, the sub lead 40 includes a main body portion 41, an edge portion 42, and extension portions 431, 432, and 433. The main body portion 41 has a long rectangular plate shape in the second direction x when viewed from the thickness direction z.

Figure 9:
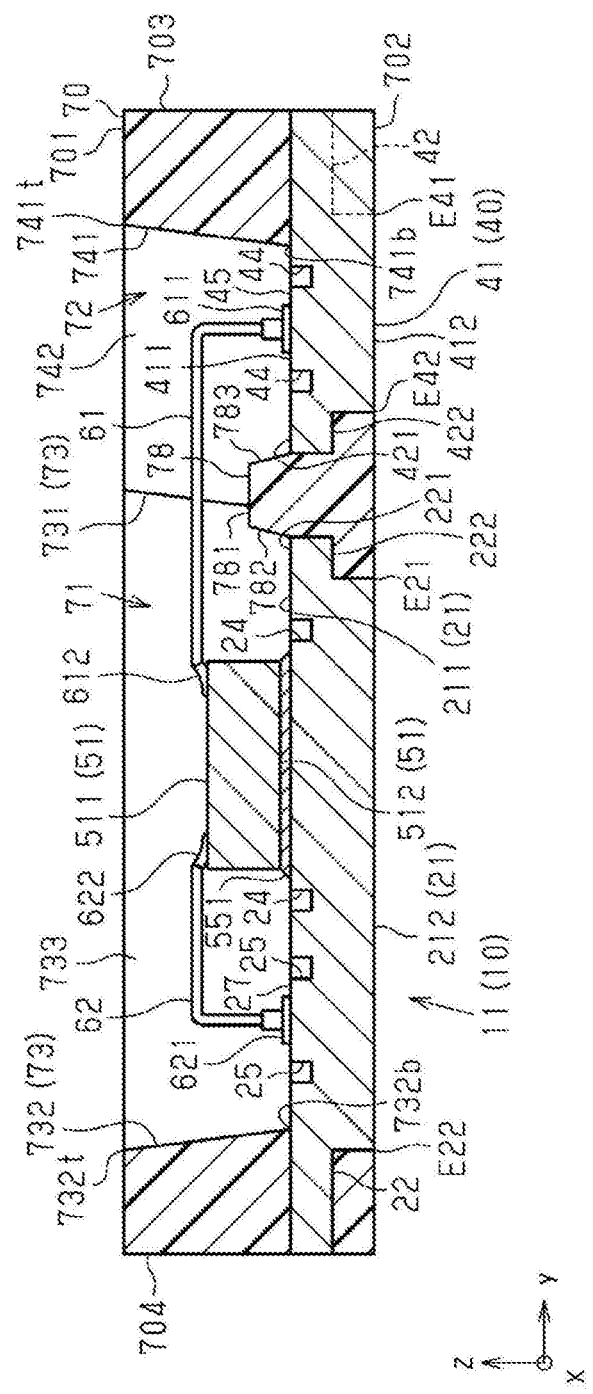
FIG. 9 is a cross-sectional view taken along line 9-9 in FIG. 1.

The main body portion 41 includes a main surface 411 and a back surface 412. The main surface 411 and the back surface 412 face each other in the thickness direction z. As shown in FIG. 9, the main surface 411 faces the same direction as the main surface 211 of the main body portion 21 of the first element mounting portion 11, which serves as the main surface of the main lead 10. The main surface 411 of the main body portion 41 is located at the same position as the main surface 211 of the main body portion 21 of the first element mounting portion 11 in the thickness direction z. That is, the main surface 411 of the main body portion 41 of the sub lead 40 and the main surface 211 of the main body portion 21 of the first element mounting portion 11 are located on the same plane.

The thickness of the main body portion 41 of the sub lead 40 is the same as the thickness of the main body portion 21 of the first element mounting portion 11 and the thickness of the main body portion 31 of the second element mounting portion 12. Therefore, as shown in FIG. 2, the back surface 412 of the main body portion 41 of the sub lead 40 is flush with the case back surface 702 of the case 70 and is exposed from the case back surface 702.

The main body portion 41 includes a groove 44 recessed from the main surface 411 toward the back surface 412. In the first embodiment, the groove 44 is disposed at a position on the case outer side surface 706 side from the center of the case 70 in the second direction x.

The groove 44 is formed in an annular shape when viewed from the thickness direction z. The groove 44 includes groove portions 441 and 442 extending along the second direction x, and semi-annular groove portions 443 and 444 connecting both ends of the groove portions 441 and 442, respectively. When viewed in the thickness direction z, the groove 44 is formed in an elliptical annular shape that bulges in a semicircular shape on both sides in the width direction when viewed from the thickness direction z. The depth of the groove 44 is, for example, about 50 μm. In the first embodiment, the inside of the annular groove 44 is a first wire bonding portion 45.

As shown in FIGS. 2 and 3, the main body portion 41 includes a side surface 413 on the second element mounting portion 12 side. A portion between the side surface 413 and the annular groove 44 is a second wire bonding portion 46.

The edge portion 42 is provided along the periphery of the main body portion 41. That is, the edge portion 42 is provided on both sides of the main body portion 41 in the first direction y and the second direction x. The edge portion 42 is a portion thinner than the main body portion 41. The thickness of the edge portion 42 is, for example, about 0.1 mm. The main surface 421 of the edge portion 42 is located at the same position as the main surface 411 of the main body portion 41 in the thickness direction z. The back surface 422 of the edge portion 42 is located closer to the main surface 411 of the main body portion 41 than the back surface 412 of the main body portion 41. That is, the edge portion 42 is not exposed from the case back surface 702 of the case 70. Such edge portion 42 can be formed by etching or pressing a base material forming the main lead 10.

The extension portions 431 and 432 extend outward from the edge portion 42. The extension portion 433 extends from the main body portion 41 to the outside of the edge portion 42. The extension portions 431 and 432 extend from the end portion of the edge portion 42 of the main lead 10 opposite to the second element mounting portion 12 to the case outer side surface 706. In the first embodiment, the thicknesses of the extension portions 431 and 432 are equal to the thickness of the edge portion 42. The extension portions 431 and 432 are arranged along the first direction y. The extension portions 431 and 432 are disposed at positions overlapping the extension portions 331 and 332 of the second element mounting portion 12 in the second direction x.

As shown in FIG. 4, the end surfaces 431s and 432s of the extension portions 431 and 432 are flush with the case outer side surface 706 of the case 70 and are exposed from the case outer side surface 706. The base material of the sub lead 40 is exposed on each of the end surfaces 431s and 432s. Note that a plating layer may be formed on the end surfaces 431s and 432s of the extension portions 431 and 432.

The extension portion 433 extends in the first direction y from the end portion of the main body portion 41 opposite to the main lead 10. The extension portion 433 is disposed at a position overlapping the extension portion 233 of the main lead 10 in the first direction y. The extension portion 433 includes two thick portions T21 and T22 and a thin portion T13 between the thick portions T21 and T22. In the extension portion 433, the thick portions T21 and T22 are arranged along the second direction x. In the first embodiment, the thick portions T21 and T22 have the same thickness as the main body portion 41, and the thin portion T13 has the same thickness as the edge portion 42. Note that the thicknesses of the thick portions T21 and T22 and the thin portion T23 may be changed as appropriate.

As shown in FIG. 5, the end surface 433s of the extension portion 433 is flush with the case outer side surface 703 of the case 70 and is exposed from the case outer side surface 703. The base material of the sub lead 40 is exposed on the end surface 433s. Note that a plating layer may be formed on the end surface 433s of the extension portion 433.

The main lead 10 and the sub lead 40 can be formed by etching or pressing a base material forming the main lead 10 and the sub lead 40. The edge portions 22 and 32 and the connecting portion 13 of the main lead 10 and the edge portion 42 of the sub lead 40 can be formed by half-etching or pressing a base material. The extension portions 231 to 234 and 331 to 333 of the main lead 10 and the extension portions 431 to 433 of the sub lead 40 can be formed by half-etching or pressing a base material, similarly to the edge portion. Then, the grooves 24 and 25 of the main lead 10 and the groove 44 of the sub lead 40 can be formed by half-etching or pressing a base material, similarly to the edge portion, and the like.

Figure 6:
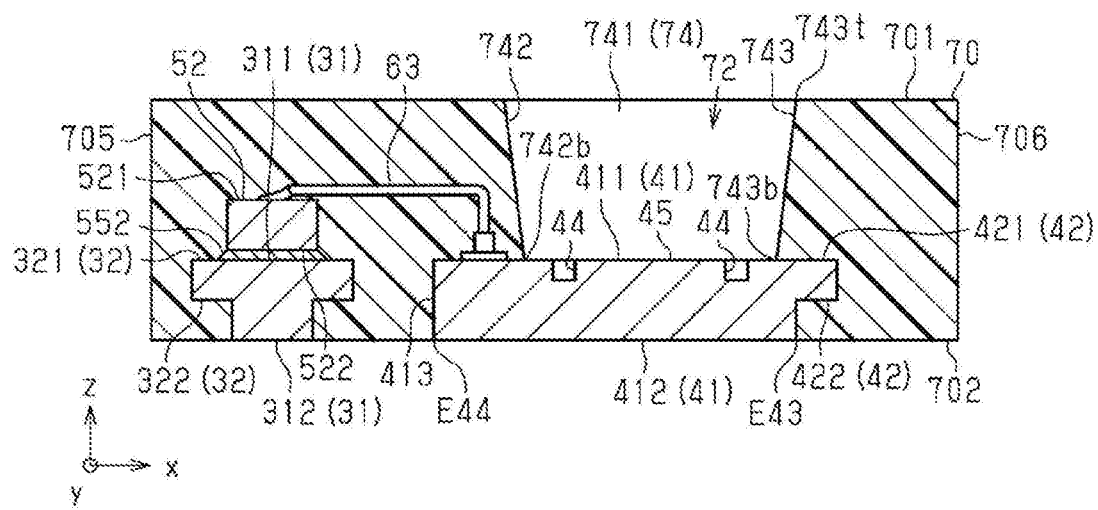
FIG. 6 is a cross-sectional view taken along line 6-6 in FIG. 1.

As shown in FIGS. 3 and 6 to 9, in the first element mounting portion 11, the main surface 211 of the main body portion 21, the main surface 221 of the edge portion 22, and the main surfaces of the extension portions 231 to 234 are flush with each other. They form a main surface 111 of the first element mounting portion 11. As shown in FIGS. 3, 6, and 8, in the second element mounting portion 12, the main surface 311 of the main body portion 31, the main surface 321 of the edge portion 32, and the main surfaces of the extension portions 331 to 333 are flush with each other. They form a main surface 121 of the second element mounting portion 12. Then, as shown in FIGS. 3 and 8, the main surface 111 of the first element mounting portion 11, a main surface 131 of the connecting portion 13, and the main surface 121 of the second element mounting portion 12 are flush with each other. They form a main surface 101 of the main lead 10. As shown in FIG. 8, the back surface 212 of the main body portion 21 of the first element mounting portion 11, the back surface 312 of the main body portion 31 of the second element mounting portion 12, and the back surfaces of the extension portions 231 to 233 (the back surfaces of the thick portions T11 and T12 of each extension portion) are flush with each other. They form a back surface 102 of the main lead 10.

The main surface 411 of the main body portion 41 of the sub lead 40, the main surface 421 of the edge portion 42, and the main surfaces of the extension portions 431 to 433 are flush with each other, and form a main surface 401 of the sub lead 40. The back surface 412 of the main body portion 41 and the back surface of the extension portion 433 (the back surfaces of the thick portions T21 and T22) are flush with each other. They form a back surface 402 of the sub lead 40.

As shown in FIGS. 1, 3, 7, and 9, the semiconductor light-emitting element 51 is mounted on the die bonding portion 26 of the first element mounting portion 11. The semiconductor light-emitting element 51 has a substantially rectangular parallelepiped shape. The semiconductor light-emitting element 51 includes a main surface 511 and a back surface 512. The main surface 511 and the back surface 512 face opposite sides in the thickness direction z. The main surface 511 is a surface facing the same direction as the main surface 211 of the main body portion 21, and the back surface 512 is a surface opposed to the main surface 211 of the main body portion 21.

The semiconductor light-emitting element 51 is, for example, a light-emitting diode (LED) element. The semiconductor light-emitting element 51 of the first embodiment is a semiconductor chip formed by laminating a semiconductor material such as gallium nitride on an insulating substrate such as sapphire. As shown in FIG. 1, the semiconductor light-emitting element 51 includes an electrode 514 and an electrode 515 on the main surface 511. The electrodes 514 and 515 are formed diagonally on the rectangular main surface 511. The electrode 514 is, for example, a cathode electrode, and the electrode 515 is, for example, an anode electrode.

Figure 7:
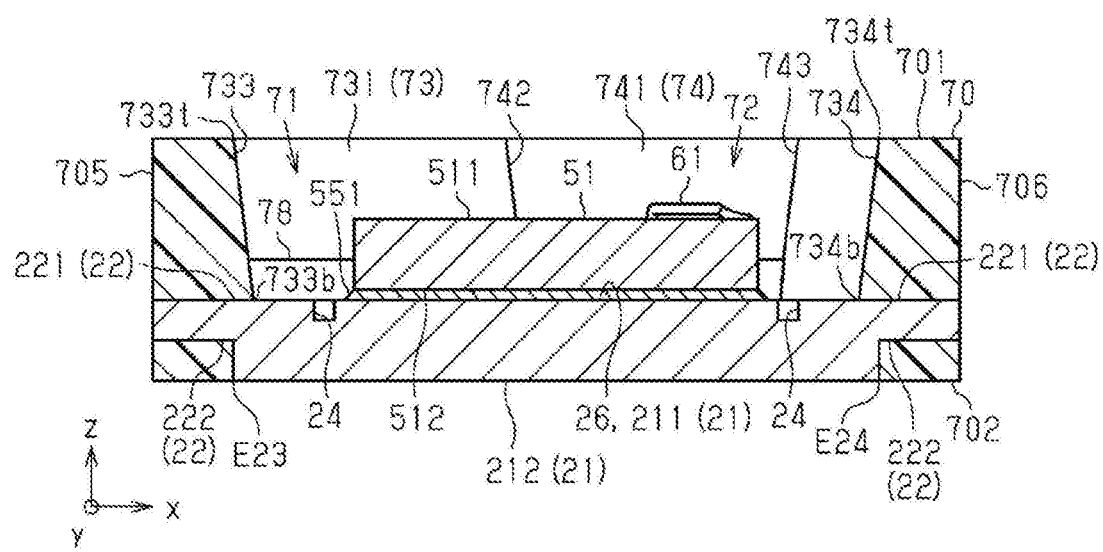
FIG. 7 is a cross-sectional view taken along line 7-7 in FIG. 1.

As shown in FIGS. 7 and 9, the back surface 512 of the semiconductor light-emitting element 51 is connected to the first element mounting portion 11 of the main lead 10 by a bonding material 551. The bonding material 551 is made of, for example, a synthetic resin (a so-called Ag paste) whose main material is an epoxy resin containing Ag. The back surface 512 of the semiconductor light-emitting element 51 is connected to the main lead 10 via the bonding material 551 having conductivity.

As shown in FIG. 1, the electrode 514 is connected to a second end 612 of a wire 61, and a first end 611 of the wire 61 is connected to the first wire bonding portion 45 of the sub lead 40. The electrode 515 is connected to a second end 622 of a wire 62, and a first end 621 of the wire 62 is connected to the wire bonding portion 27 of the main lead 10. The wire 61 is made of, for example, Au. The wire 62 is made of, for example, Au.

As shown in FIG. 9, in the wires 61 and 62, the first ends 611 and 621 are first bonding portions in a wire bonding process, and the second ends 612 and 622 are second bonding portions. In this way, by connecting the first ends 611 and 621 to the sub lead 40 or the main lead 10, it is possible to prevent the loop of the wires 61 and 62 from becoming too high.

As shown in FIGS. 1 and 6, the protective element 52 is mounted on the main body portion 31 of the second element mounting portion 12. That is, the main body portion 31 of the second element mounting portion 12 is a die bonding portion on which the protective element 52 is mounted. The protective element 52 is, for example, a Zener diode. As the protective element 52, various protective elements mounted on a general semiconductor light-emitting device can be used. The protective element 52 has a substantially rectangular parallelepiped shape. The protective element 52 includes a main surface 521 and a back surface 522. The main surface 521 and the back surface 522 face opposite sides in the thickness direction z. Electrodes (not shown) are provided on the main surface 521 and the back surface 522, respectively. The electrode on the main surface 521 is, for example, an anode electrode, and the electrode on the back surface 522 is, for example, a cathode electrode.

As shown in FIG. 6, the back surface 522 of the protective element 52 is connected to the second element mounting portion 12 of the main lead 10 by a bonding material 552. The bonding material 552 is made of, for example, a synthetic resin (a so-called Ag paste) whose main material is an epoxy resin containing Ag, and has conductivity. The electrode on the back surface 522 of the protective element 52 is connected to the main lead 10 via the bonding material 552 having conductivity. A second end 632 of a wire 63 is connected to the electrode on the main surface 521 of the protective element 52. A first end 631 of the wire 63 is connected to the second wire bonding portion 46 of the main body portion 41 of the sub lead 40. The wire 63 is made of, for example, Au.

As shown in FIG. 6, in the wire 63, the first end 631 is the first bonding portion in the wire bonding process, and the second end 632 is the second bonding portion. By connecting the first end to the sub lead 40 in this way, it is possible to prevent the loop of the wire 63 from becoming too high.

The case 70 is made of white synthetic resin. As the material of the case 70, thermosetting resin is used. An example of the thermosetting resin may include an unsaturated polyester resin. As the material of the case 70, epoxy resin, silicone resin, acrylate resin, polyurethane, or the like is used. The case 70 is made white by adding, for example, titanium oxide to the thermosetting resin as the material. In addition, silica, alumina, etc. may be used as an additive.

The case 70 includes a main opening 71 and a sub opening 72. The main opening 71 is formed so as to expose a portion of the main surface of the main lead 10. Specifically, the main opening 71 is formed so as to expose a portion of the main surface 111 of the first element mounting portion 11 of the main lead 10. The die bonding portion 26 and the wire bonding portion 27 surrounded by the grooves 24 and 25 are formed on the main surface 111 of the first element mounting portion 11. The main opening 71 is formed so as to expose a region including the grooves 24 and 25. In the first embodiment, the main opening 71 is formed in a substantially rectangular shape when viewed from the thickness direction z.

As shown in FIG. 1, the main opening 71 is partitioned by a main inner side surface 73 formed on the case 70. The main inner side surface 73 extends in the thickness direction z from the case main surface 701 of the case 70 toward the main surface 111 of the first element mounting portion 11, that is, the main surface 101 of the main lead 10.

As shown in FIGS. 7, 8, and 9, the main inner side surface 73 is inclined so as to move away from the die bonding portion 26 in a direction orthogonal to the thickness direction z, that is, away from the semiconductor light-emitting element 51 mounted on the die bonding portion 26, from the main surface 101 side of the main lead 10 toward the case main surface 701 of the case 70. The main inner side surface 73 functions as a reflecting surface that reflects light emitted from the semiconductor light-emitting element 51.

As shown in FIG. 1, the main inner side surface 73 includes a first main inner side surface 731, a second main inner side surface 732, a third main inner side surface 733, and a fourth main inner side surface 734. As shown in FIGS. 1, 8, and 9, the first main inner side surface 731 faces the side opposite to the sub lead 40. The first main inner side surface 731 and the second main inner side surface 732 face opposite sides in the first direction y. As shown in FIGS. 1 and 7, the third main inner side surface 733 and the fourth main inner side surface 734 face opposite sides in the second direction x.

As shown in FIGS. 8 and 9, in the second main inner side surface 732, an end portion 732b on the main lead 10 side is located inside the main body portion 21 closer than an end portion E22 of the main body portion 21 when viewed in the thickness direction z. In the second main inner side surface 732 of the first embodiment, an end portion 732t on the case main surface 701 side is formed at a position overlapping the end portion E22 of the main body portion 21 of the first element mounting portion 11 when viewed in the thickness direction z.

As shown in FIG. 7, in the third main inner side surface 733, an end portion 733b on the main lead 10 side is located inside the main body portion 21 closer than an end portion E23 of the main body portion 21 when viewed in the thickness direction z. In the third main inner side surface 733 of the first embodiment, an end portion 733t on the case main surface 701 side is formed at a position overlapping the end portion E23 of the main body portion 21 of the first element mounting portion 11 when viewed in the thickness direction z.

As shown in FIG. 7, in the fourth main inner side surface 734, an end portion 734b on the main lead 10 side is located inside the main body portion 21 closer than an end portion E24 of the main body portion 21 when viewed in the thickness direction z. In the fourth main inner side surface 734 of the first embodiment, an end portion 734t on the case main surface 701 side is formed at a position overlapping the end portion E24 of the case outer side surface 705 side of the main body portion 21 of the first element mounting portion 11 when viewed in the thickness direction z.

The case 70 includes a connecting portion 75 that is convex inside the main opening 71 on the sub lead 40 side with respect to the end portion of the fourth main inner side surface 734 on the sub lead 40 side. The connecting portion 75 is formed in a quarter circle shape when viewed from the thickness direction z. Then, a side surface 751 of the connecting portion 75 becomes a curved surface protruding toward the inside of the main opening 71. In addition, the side surface 751 of the connecting portion 75 is inclined so as to move away from the semiconductor light-emitting element 51 in a direction orthogonal to the thickness direction z from the main lead 10 to the case main surface 701 in the thickness direction z. The main inner side surface 73 includes the side surface 751 of the connecting portion 75.

As shown in FIGS. 1 and 9, the sub opening 72 extends from the first main inner side surface in the first direction y. The sub opening 72 exposes a portion of the main surface of the sub lead 40. The first wire bonding portion 45 surrounded by the groove 44 is formed on the main surface of the sub lead 40. The sub opening 72 is formed so as to expose a region including the groove 44. The sub opening 72 is formed in a substantially rectangular shape when viewed from the thickness direction.

The sub opening 72 is partitioned by a sub inner side surface 74 formed in the case 70. As shown in FIGS. 6, 7, and 9, the sub inner side surface 74 extends in the thickness direction z from the case main surface 701 of the case 70 toward the main surface 101 of the main lead 10.

As shown in FIGS. 6 and 9, the sub inner side surface 74 is inclined so as to move away from the first wire bonding portion 45 in a direction orthogonal to the thickness direction z, that is, away from the first end 611 of the wire 61 connected to the first wire bonding portion 45, from the main surface 401 side of the sub lead 40 toward the case main surface 701 of the case 70. The sub inner side surface 74 functions as a reflecting surface that reflects light emitted from the semiconductor light-emitting element 51.

As shown in FIG. 1, the sub inner side surface 74 includes a first sub inner side surface 741, a second sub inner side surface 742, and a third sub inner side surface 743. The first sub inner side surface 741 faces the main lead 10 side. In addition, the first sub inner side surface 741 faces the same direction as the first main inner side surface 731. The second sub inner side surface 742 and the third sub inner side surface 743 face opposite sides in the second direction x. In addition, the second sub inner side surface 742 faces the same direction as the third main inner side surface 733, and the third sub inner side surface 743 faces the same direction as the fourth main inner side surface 734.

As shown in FIG. 9, in the first sub inner side surface 741, an end portion 741b on the sub lead 40 side is located inside the main body portion 41 closer than an end portion E41 of the main body portion 41 when viewed in the thickness direction z. In the first sub inner side surface 741 of the first embodiment, an end portion 741t on the case main surface 701 side is formed at a position overlapping the end portion E41 of the main body portion 41 of the sub inner side surface 74 when viewed in the thickness direction z.

As shown in FIG. 6, in the second sub inner side surface 742, an end portion 742b on the sub lead 40 side is located inside the main body portion 41 closer than an end portion E43 of the main body portion 41. In the third sub inner side surface 743, an end portion 743b on the sub lead 40 side is located inside the main body portion 41 closer than an end portion E44 of the main body portion 41. In the first sub inner side surface 741 of the first embodiment, an end portion 743t on the case main surface 701 side is formed at a position overlapping the end portion E44 of the main body portion 41 of the sub inner side surface 74 when viewed in the thickness direction z.

As shown in FIG. 1, the case 70 includes a quarter circle-shaped connecting portion 76 when viewed from the thickness direction z between the first main inner side surface 731 of the main opening 71 and the second sub inner side surface 742 of the sub opening 72. The side surface 761 of the connecting portion 76 is a curved surface that connects the first main inner side surface 731 extending in the second direction x and the second sub inner side surface 742 extending in the first direction y. Further, the side surface 761 of the connecting portion 76 is inclined so as to move away from the semiconductor light-emitting element 51 in a direction orthogonal to the thickness direction z as it goes toward the case main surface 701 in the thickness direction z.

The third sub inner side surface 743 is located closer to the center of the case 70 than the fourth main inner side surface 734 in the second direction x. Further, the third sub inner side surface 743 is formed so as to extend in the first direction y continuously from the side surface 761 connected to the first main inner side surface 731.

The sub inner side surface 74 includes connecting surfaces 746 and 747. The connecting surface 746 is a surface that is provided between the first sub inner side surface 741 and the second sub inner side surface 742 and continuously connects them. The connecting surface 747 is a surface that is provided between the first sub inner side surface 741 and the third sub inner side surface 743 and continuously connects them. The connecting surfaces 746 and 747 have a quarter annular shape when viewed in the thickness direction z. The connecting surfaces 746 and 747 are inclined so as to move away from the first wire bonding portion 45 in a direction orthogonal to the thickness direction z from the main surface 401 of the sub lead 40 to the case main surface 701 of the case 70.

As shown in FIG. 2, the case 70 includes a partition portion 77 interposed between the main lead 10 and the sub lead 40. The partition portion 77 includes a first partition portion 771 interposed between the first element mounting portion 11 of the main lead 10 and the sub lead 40 in the first direction y, and a second partition portion 772 interposed between the second element mounting portion 12 of the main lead 10 and the sub lead 40 in the second direction x.

The first partition portion 771 is interposed between the edge portion 22 of the first element mounting portion 11 and the edge portion 42 of the sub lead 40. The first partition portion 771 is formed so as to cover the back surface 222 of the edge portion 22 of the first element mounting portion 11 on the sub lead 40 side and the back surface 422 of the edge portion 42 of the sub lead 40 on the first element mounting portion 11 side.

The second partition portion 772 is interposed between the edge portion 32 of the second element mounting portion 12 and the edge portion 42 of the sub lead 40 and between the edge portion 32 of the second element mounting portion 12 and the main body portion 41 of the sub lead 40. The second partition portion 772 is formed to cover the back surface 322 of the edge portion 32 of the second element mounting portion 12 on the sub lead 40 side and the back surface 422 of the edge portion 42 of the sub lead 40.

As shown in FIGS. 1, 4, and 9, the case 70 includes a wall portion 78 located between the main opening 71 and the sub opening 72. As shown in FIGS. 1 and 4, the wall portion 78 extends along the second direction x. As shown in FIG. 9, the wall portion 78 protrudes from the main surface 101 of the main lead 10 and the main surface 401 of the sub lead 40 toward the case main surface 701 of the case 70. As shown in FIGS. 1 and 9, the wall portion 78 is connected to the first partition portion 771. For example, the wall portion 78 and the first partition portion 771 are integrally formed in one step.

As shown in FIGS. 1, 4, and 9, the wall portion 78 is formed in a trapezoidal shape when viewed from the second direction x, and includes an upper surface 781 and wall surfaces 782 and 783. The upper surface 781 faces the same direction as the main surface 101 of the main lead 10, the main surface 401 of the sub lead 40, and the case main surface 701 of the case 70. The upper surface 781 is located between the case main surface 701 of the case 70 and the main surfaces 101, 401 of the main lead 10 and the sub lead 40, and. In the thickness direction z, a distance from the main surface 101 of the main lead 10 and the main surface 401 of the sub lead 40 to the upper surface of the wall portion 78, that is, the height of the wall portion 78, may be 30 µm or more.

As shown in FIG. 9, the wire 61 is interposed between the upper surface 781 of the wall portion 78 and the case main surface 701 of the case 70 in the thickness direction z. The upper surface 781 of the wall portion 78 may be lower than the main surface of the semiconductor light-emitting element 51 in the thickness direction z, that is, it may be between the main surface 511 of the semiconductor light-emitting element 51 and the main surface 101 of the main lead 10 in the thickness direction z. This prevents the wire 61 connecting the semiconductor light-emitting element 51 and the sub lead 40 from becoming too high.

As shown in FIGS. 1, 4, and 9, the wall portion 78 includes the wall surface 782 on the main opening 71 side and the wall surface 783 on the sub opening 72 side in the first direction y. The wall surface 782 is inclined so as to move away from the die bonding portion 26 in the first direction y, that is, the semiconductor light-emitting element 51, from the main lead 10 to the upper surface 781. The wall surface 783 is inclined so as to move away from the first wire bonding portion 45 in the first direction y, that is, the first end 611 of the wire 61, from the sub lead 40 to the upper surface 781.

As shown in FIGS. 1 and 4, the first main inner side surface 731 of the case 70 extends from the upper surface 781 of the wall portion 78 to the case main surface 701 of the case 70. Therefore, as shown in FIGS. 8 and 9, the first main inner side surface 731 is located closer to the sub lead 40, that is, the protective element 52 side, than the wall surface 782 of the wall portion 78 on the main lead 10 side.

As shown in FIG. 1, the case 70 includes an element covering portion 79 that covers the protective element 52 and the wire 63 connected to the protective element 52. The side surface of the element covering portion 79 on the main lead 10 side is the first main inner side surface 731 that partitions the main opening 71, and the side surface on the sub lead 40 side is the second sub inner side surface 742 that partitions the sub opening 72.

The sealing member 90 fills the main opening 71 and the sub opening 72 of the case 70. The sealing member 90 covers the main lead 10 exposed via the main opening 71, the sub lead 40 exposed via the sub opening 72, the semiconductor light-emitting element 51 mounted on the main lead 10, the wire 61 connecting the semiconductor light-emitting element 51 and the sub lead 40, and the wire 62 connecting the semiconductor light-emitting element 51 and the main lead 10. The sealing member 90 protects the semiconductor light-emitting element 51 and the wires 61 and 62.

The sealing member 90 is a translucent member that transmits light emitted from the semiconductor light-emitting element 51. A material of the sealing member 90 is, for example, synthetic resin. Examples of the material of the sealing member 90 may include transparent or semi-transparent resin materials such as silicone resin, epoxy resin, acrylic resin, polyvinyl resin, and the like. The sealing member 90 may include a diffusing material that diffuses light from the semiconductor light-emitting element 51, a phosphor that is excited by light from the semiconductor light-emitting element 51 to emit light having a wavelength different from the wavelength of the light from the semiconductor light-emitting element 51, and the like.

(Operation)

Figure 10:
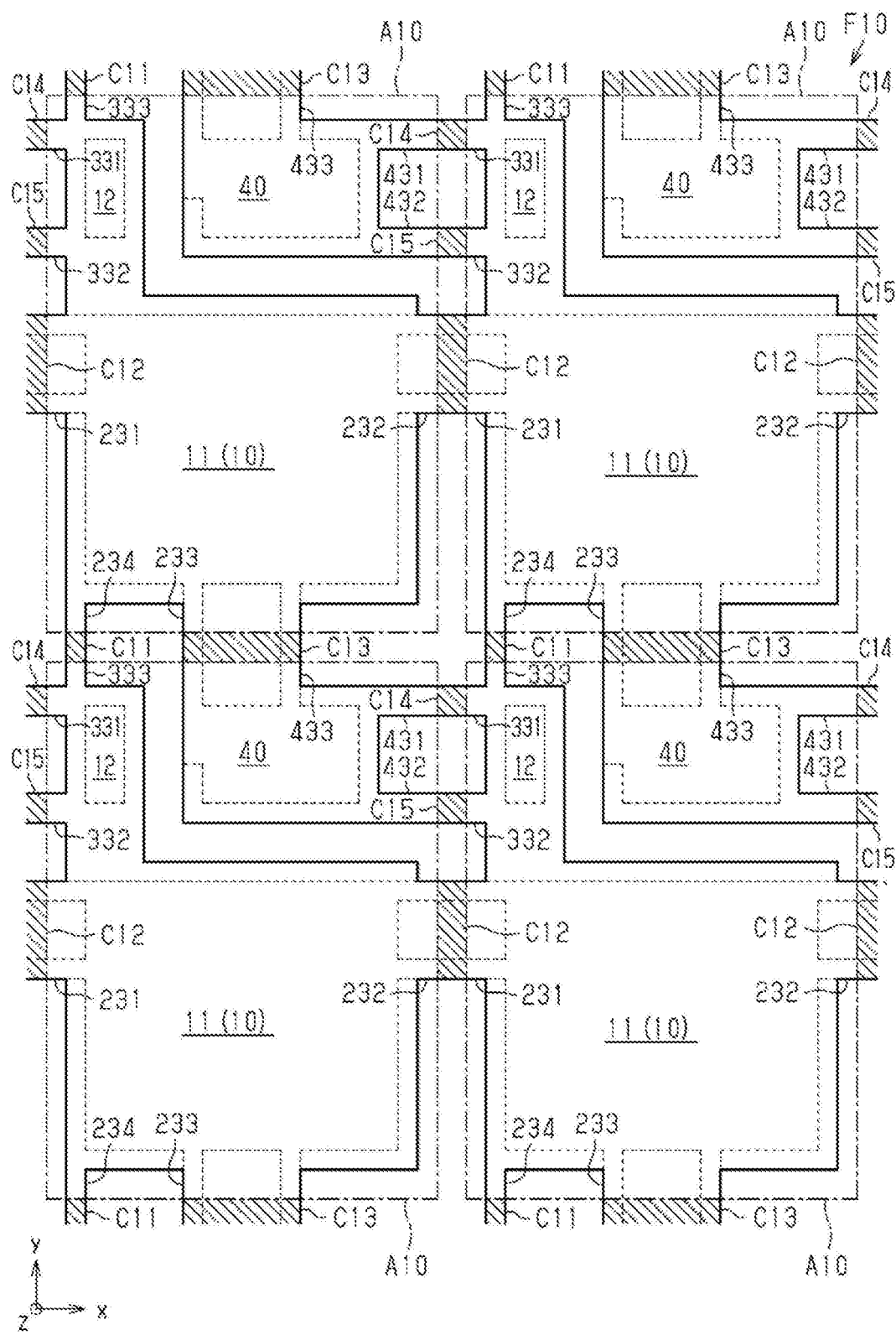
FIG. 10 is a plan view showing a portion of a lead frame for the semiconductor light-emitting device according to the first embodiment.

Next, the operation of the semiconductor light-emitting device A10 of the first embodiment will be described. As shown in FIG. 10, the semiconductor light-emitting device A10 is formed using a lead frame F10 including the main lead 10 and the sub lead 40.

FIG. 10 shows a portion of the lead frame F10 for manufacturing the semiconductor light-emitting device A10 of the first embodiment. In addition, FIG. 10 shows a portion for manufacturing four semiconductor light-emitting devices A10 (shown by dash-dotted lines in the figure) which are adjacent to each other in the first direction y and the second direction x.

Each of the semiconductor light-emitting devices A10 formed adjacent to each other in the first direction y and the second direction x includes the main lead 10 and the sub lead 40, and the main lead 10 includes the first element mounting portion 11, the second element mounting portion 12, and the connecting portion 13 connecting the first element mounting portion 11 and the second element mounting portion 12. The lead frame F10 includes a base material forming the main lead 10 and the sub lead 40. The lead frame F10 is produced, for example, by etching or pressing a metal plate made of Cu, Ni, or an alloy containing at least one selected from the group thereof. Members that form the lead frame F10 will be described using the names and reference numerals of the members that will eventually become the semiconductor light-emitting device A10.

As shown in FIG. 10, the main lead 10 and the sub lead 40 forming the semiconductor light-emitting device A10 are connected to adjacent main leads 10 and sub leads 40 by connecting portions C11 to C15. In FIG. 10, the connecting portions C11 to C15 are hatched to facilitate understanding. The connecting portions C11 to C15 are portions that are removed by, for example, dicing when dividing the semiconductor light-emitting device Al0 into individual pieces.

The extension portion 234 of the first element mounting portion 11 and the extension portion 233 of the second element mounting portion 12 adjacent to the first element mounting portion 11 in the first direction y are connected to each other by the connecting portion C11. The extension portion 232 of the first element mounting portion 11 and the extension portion 231 of another first element mounting portion 11 adjacent to the first element mounting portion 11 in the second direction x are connected to each other by the connecting portion C12. That is, in the first direction y, the adjacent first element mounting portion 11 and second element mounting portion 12 are connected to each other by the connecting portion C11. Further, in the second direction x, the adjacent first element mounting portions 11 are connected to each other by the coupling portion C12.

The extension portion 233 of the first element mounting portion 11 and the extension portion 433 of the sub lead 40 adjacent to the first element mounting portion 11 in the first direction y are connected to each other by the connecting portion C13. The extension portions 431 and 432 of the sub lead 40 and the extension portions 331 and 332 of the second element mounting portion 12 adjacent to the sub lead 40 in the second direction x are connected to each other by the connecting portions C14 and C15. That is, in the first direction y, the adjacent first element mounting portion 11 and sub lead 40 are connected to each other by the connecting portion C13. Further, in the second direction x, the adjacent sub lead 40 and second element mounting portion 12 are connected to each other by the connecting portions C14 and C15.

In this way, all the main leads 10 included in the lead frame F10 are connected to each other by the connecting portions C11 and C12 in the first direction y and the second direction x. Further, each sub lead 40 is connected to the first element mounting portion 11 of the main lead 10 by the connecting portion C13 in the first direction y, and is connected to the second element mounting portion 12 of the main lead 10 by the connecting portions C14 and C15 in the second direction x. That is, all the main leads 10 and the sub leads 40 included in the lead frame F10 are connected by the connecting portions C11 to C15. With such a configuration, the lead frame F10 is suppressed from being bent and is easily transported. Further, since all the main leads 10 and the sub leads 40 are connected, a plating layer can be easily formed on the surfaces of the main leads 10 and the sub leads 40 by an electrolytic plating method or the like.

Figure 12:
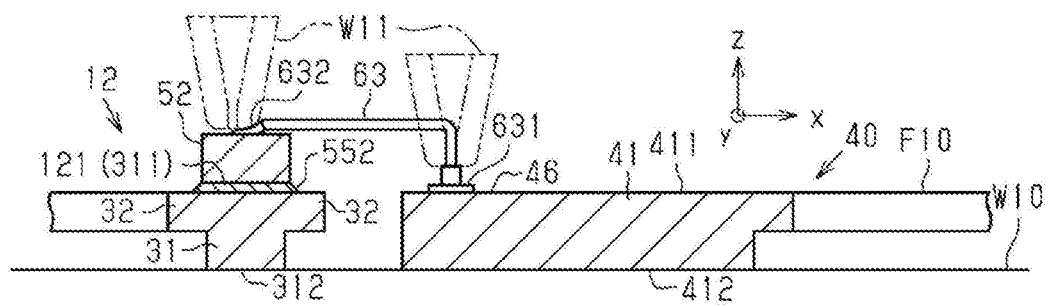
FIG. 12 is a cross-sectional view of the lead frame for explaining wire bonding and die bonding.

As shown in FIG. 12, the protective element 52 is mounted on the second element mounting portion 12 of the main lead 10 by the bonding material 552. As shown in FIG. 12, the lead frame F10 is placed on the upper surface of a work table W10. The work table W10 is a work table such as a die bonder for mounting the protective element 52, a wire bonder for connecting the wire 63, or the like. The bonding material 552 is applied to the main surface 121 of the second element mounting portion 12. The protective element 52 is mounted on the second element mounting portion 12 using a suction collet or the like. The second element mounting portion 12 includes the main body portion 31 with the main surface 311 on which the protective element 52 is mounted. The main body portion 31 has the thickness of the lead frame F10. Accordingly, the back surface 312 of the main body portion 31 contacts the upper surface of the work table W10 of the die bonder on which the protective element 52 is mounted. Accordingly, a pressing force applied by the die bonding is received by the work table W10. Therefore, when the protective element 52 is mounted on the second element mounting portion 12, even if the protective element 52 is pushed down toward the main body portion 31 of the second element mounting portion 12, the lead frame F10 is not bent. Therefore, the protective element 52 is reliably mounted on the second element mounting portion 12.

Figure 11:
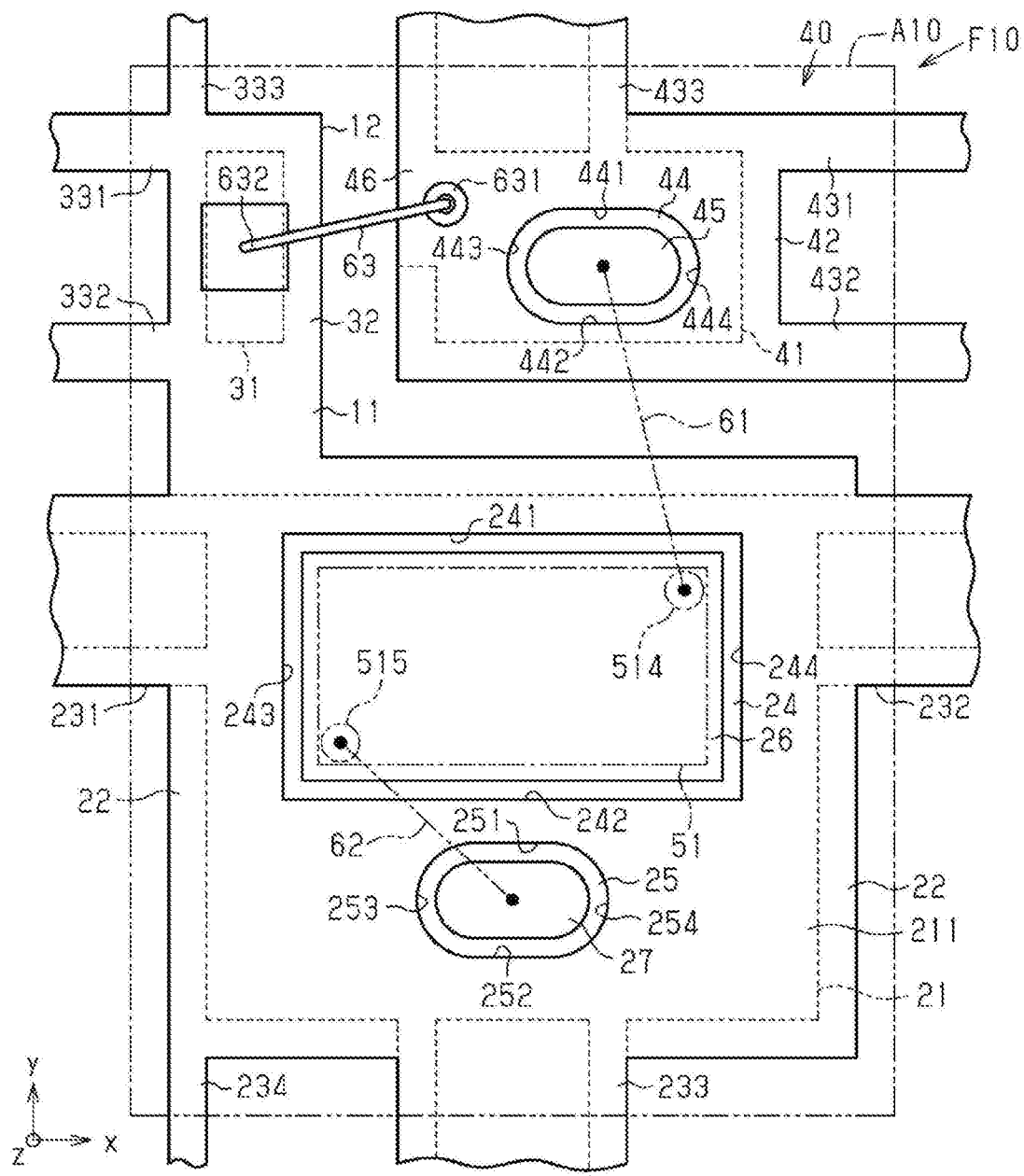
FIG. 11 is a plan view of a lead frame for explaining wire bonding and die bonding.

As shown in FIGS. 11 and 12, the protective element 52 is connected to the sub lead 40 by the wire 63. The first end 631 of the wire 63 is connected to the second wire bonding portion 46 of the sub lead 40, and the second end 632 of the wire 63 is connected to the electrode on the main surface 521 of the protective element 52. As shown in FIG. 12, the wire 63 is connected using a capillary W11 of the wire bonder. The lead frame on which the protective element 52 is mounted is placed on the work table W10. First, a tip of the wire 63 is protruded from the capillary W11 and is melted, and then the tip is pressed against the second wire bonding portion 46 of the sub lead 40 (first bonding step). Next, the capillary W11 is moved while pulling out the wire 63 from the capillary W11, and the capillary W11 presses and cuts the wire 63 against the electrode of the main surface 521 of the protective element 52 (second bonding step).

The second wire bonding portion 46 of the sub lead 40 has the thickness of the lead frame F10. Accordingly, the back surface of the second wire bonding portion 46 is in contact with the top surface of the work table W10. Accordingly, a pressing force applied by the wire bonding is received by the work table W10. Therefore, the wire 63 is reliably connected to the sub lead 40. Further, as described above, the main body portion 31 has the thickness of the lead frame F10. Accordingly, the wire 63 is reliably connected to the protective element 52.

The mounting of the semiconductor light-emitting element 51 and the connecting of the wires 61 and 62 are the same as the mounting of the protective element 52 and the connecting of the wire 63. The mounting of the semiconductor light-emitting element 51 and the connecting of the wires 61 and 62 are performed after the case 70 is formed. In FIG. 11, the semiconductor light-emitting element 51 and the wires 61 and 62 are shown by a two-dot chain line.

As shown in FIGS. 7 and 9, the first element mounting portion 11 includes the main body portion 21 on which the semiconductor light-emitting element 51 is mounted. The back surface 212 of the main body portion 21 is exposed from the case back surface 702 of the case 70 and is flush with the case back surface 702. Accordingly, when the lead frame F10 formed thereon with the case 70 is placed on the work table of the die bonder, the back surface 212 of the main body portion 21 contacts the top surface of the work table. Accordingly, a pressing force applied by the die bonding is received by the work table. Therefore, the semiconductor light-emitting element 51 is reliably mounted on the first element mounting portion 11.

As shown in FIG. 9, the semiconductor light-emitting element 51 is connected to the first wire bonding portion 45 of the sub lead 40 by the wire 61. In the sub lead 40, the back surface 412 of the main body portion 41 facing the side opposite to the first wire bonding portion 45 is exposed from the case back surface 702 of the case 70 and is flush with the case back surface 702. Accordingly, when the lead frame F10 formed thereon with the case 70 is placed on the work table of the wire bonder, the back surface 212 of the main body portion 21 contacts the top surface of the work table. Accordingly, a pressing force applied by the wire bonding is received by the work table. Therefore, the wire 61 is reliably connected to the first wire bonding portion 45 of the sub lead 40. Further, the wire 61 is reliably connected to the semiconductor light-emitting element 51.

Further, the semiconductor light-emitting element 51 is connected to the wire bonding portion 27 of the first element mounting portion 11 by the wire 62. The back surface 212 of the main body portion 21 facing the side opposite to the wire bonding portion 27 is exposed from the case back surface 702 of the case 70 and is flush with the case back surface 702. Accordingly, when the lead frame F10 formed thereon with the case 70 is placed on the work table of the wire bonder, the back surface 212 of the main body portion 21 contacts the top surface of the work table. Accordingly, a pressing force applied by the wire bonding is received by the work table. Therefore, the wire 62 is reliably connected to the wire bonding portion 27 of the first element mounting portion 11. Further, the wire 62 is reliably connected to the semiconductor light-emitting element 51.

The case 70 of the semiconductor light-emitting device A10 is obtained by molding a resin material on the lead frame F10 described above. FIGS. 13 to 16 are cross-sectional views showing a mold and a lead frame at the time of molding. The cross-sectional positions in FIGS. 13 to 16 correspond to the cross-sectional positions of the semiconductor light-emitting device A10 shown in FIGS. 6 to 9. In FIGS. 13 to 16, a two-dot chain line indicates the outer shape of the case 70 in one semiconductor light-emitting device A10.

As shown in FIGS. 13 to 16, the lead frame F10 is disposed inside a mold W20. The mold W20 includes a lower mold W21 and an upper mold W22, and the case 70 is formed by pouring a resin material into a space (cavity) W23 formed by sandwiching the lead frame F10 between the lower mold W21 and the upper mold W22.

Figure 15:
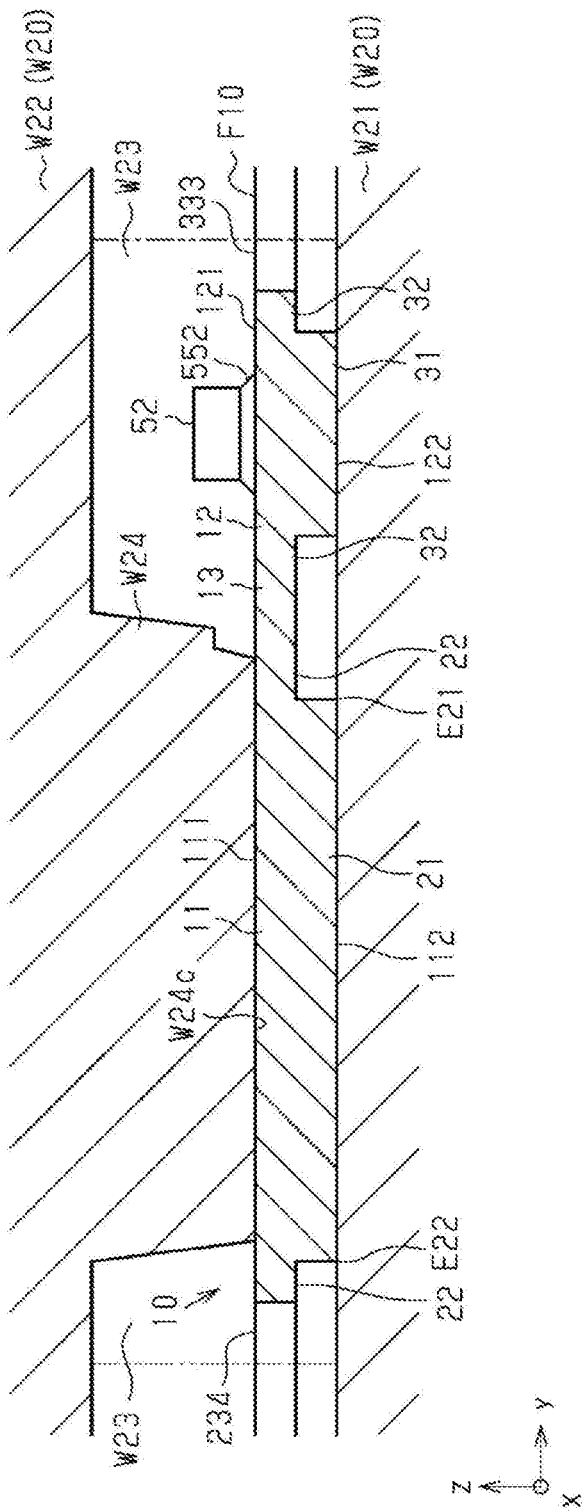
FIG. 15 is a schematic cross-sectional view showing a lead frame and a mold.

The upper mold W22 includes a first convex portion W24 for forming the main opening 71 shown in FIG. 1, and a second convex portion W25 for forming the sub opening 72. The first convex portion W24 is in contact with the main surface 111 of the first element mounting portion 11 of the main lead 10. The second convex portion W25 is in contact with the main surface 401 of the sub lead 40. As shown in FIG. 15, a concave portion W26 for forming the wall portion 78 shown in FIG. 1 is provided between the first convex portion W24 and the second convex portion W25.

Figure 13:
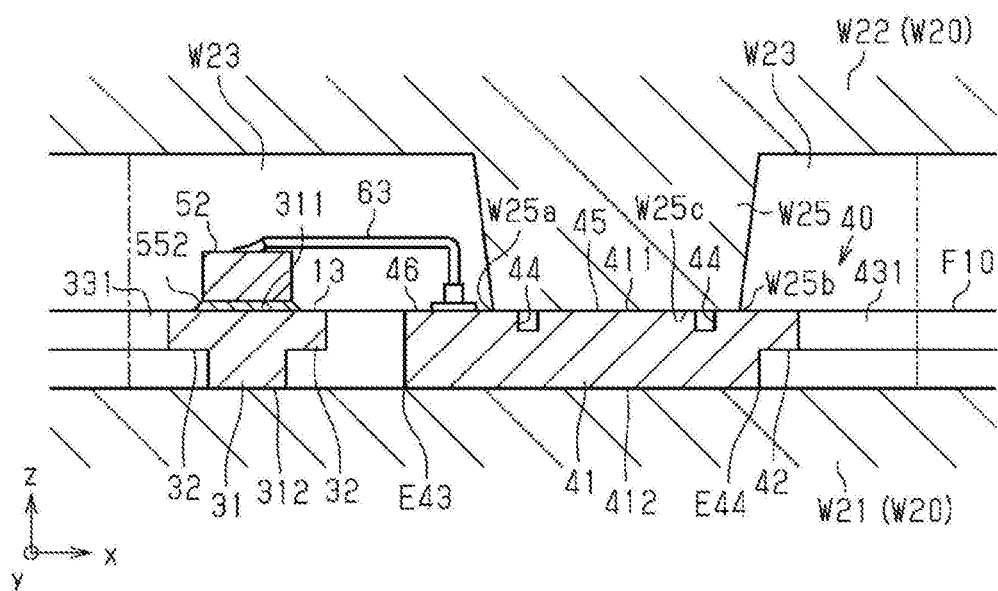
FIG. 13 is a schematic cross-sectional view showing a lead frame and a mold.

As shown in FIG. 13, the protective element 52 is mounted on the second element mounting portion 12 of the main lead 10, and the protective element 52 and the sub lead 40 are connected by the wire 63. The protective element 52 and the sub lead 40 are disposed in the space W23, and are sealed with the resin material poured into the space W23, that is, the case 70.

Figure 14:
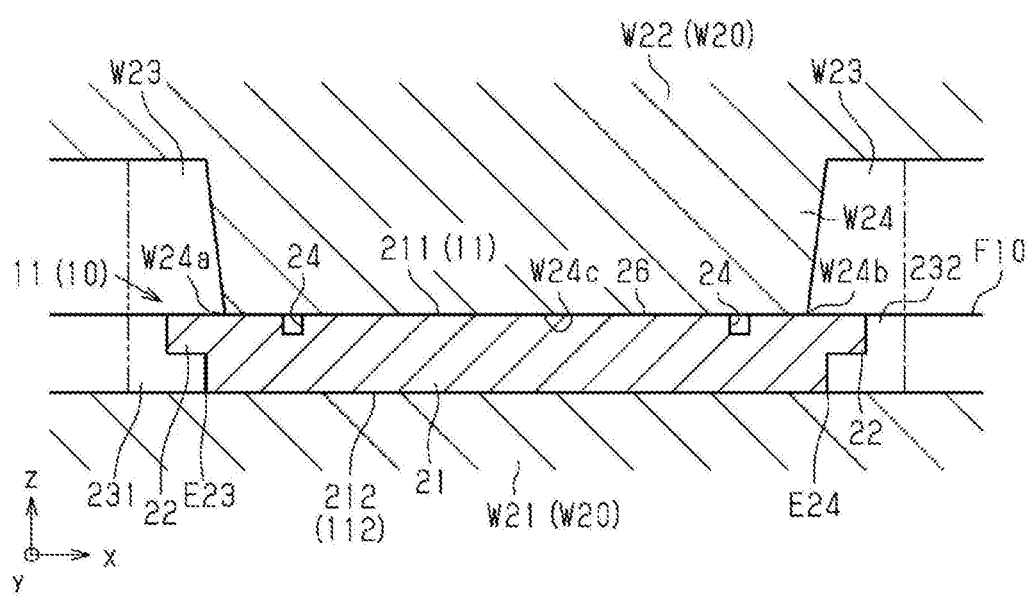
FIG. 14 is a schematic cross-sectional view showing a lead frame and a mold.

As shown in FIG. 14, in the second direction x, end portions W24a and W24b on both sides of the first convex portion W24 contact the main surface of the first element mounting portion 11, that is, the main surface 211 of the main body portion 21, inside the end portions E21 and E22 of the main body portion 21 of the first element mounting portion 11. The first element mounting portion 11 of the lead frame F10 is sandwiched between the first convex portion W24 of the upper mold W22 and the lower mold W21. Accordingly, in the second direction x, it is difficult to form a gap between a contact surface W24c of the first convex portion W24 and the main surface 211 of the main body portion 21 which is the main surface of the first element mounting portion 11, and it is difficult for the resin material forming the case 70 to enter.

The groove 24 that is recessed from the main surface 111 is formed in the first element mounting portion 11. As shown in FIG. 1, the inside of the groove 24 is the die bonding portion 26. Even if the resin material enters between the first convex portion W24 and the first element mounting portion 11, the resin material enters the groove 24 which is recessed from the main surface 211 and hardly enters the die bonding portion 26. Therefore, it is difficult for the resin material to flow into the die bonding portion 26.

As shown in FIG. 13, in the second direction x, end portions W25a and W25b on both sides of the second convex portion W25 contact the main surface of the sub lead 40, that is, the main surface 411 of the main body portion 41, inside the end portions E43 and E44 of the main body portion 41 of the sub lead 40. The sub lead 40 of the lead frame is sandwiched between the second convex portion W25 of the upper mold W22 and the lower mold W21. Accordingly, in both of the end portions W25a and W25b, it is difficult to form a gap between a contact surface W25c of the second convex portion W25 and the main surface 411 of the main body portion 41 which is the main surface of the sub lead 40, and the resin material forming the case 70 can be prevented from entering. Therefore, generation of a thin resin burr covering the main surface of the sub lead 40 is suppressed.

The sub lead 40 is formed with the groove 44 recessed from the main surface 411 of the main body portion 41. As shown in FIG. 1, the inside of the groove 44 is the first wire bonding portion 45. Even if the resin material enters between the second convex portion W25 and the sub lead 40, the resin material enters the groove 44 recessed from the main surface 411 and hardly enters the first wire bonding portion 45. Therefore, it difficult for the resin material to flow into the first wire bonding portion 45.

Figure 16:
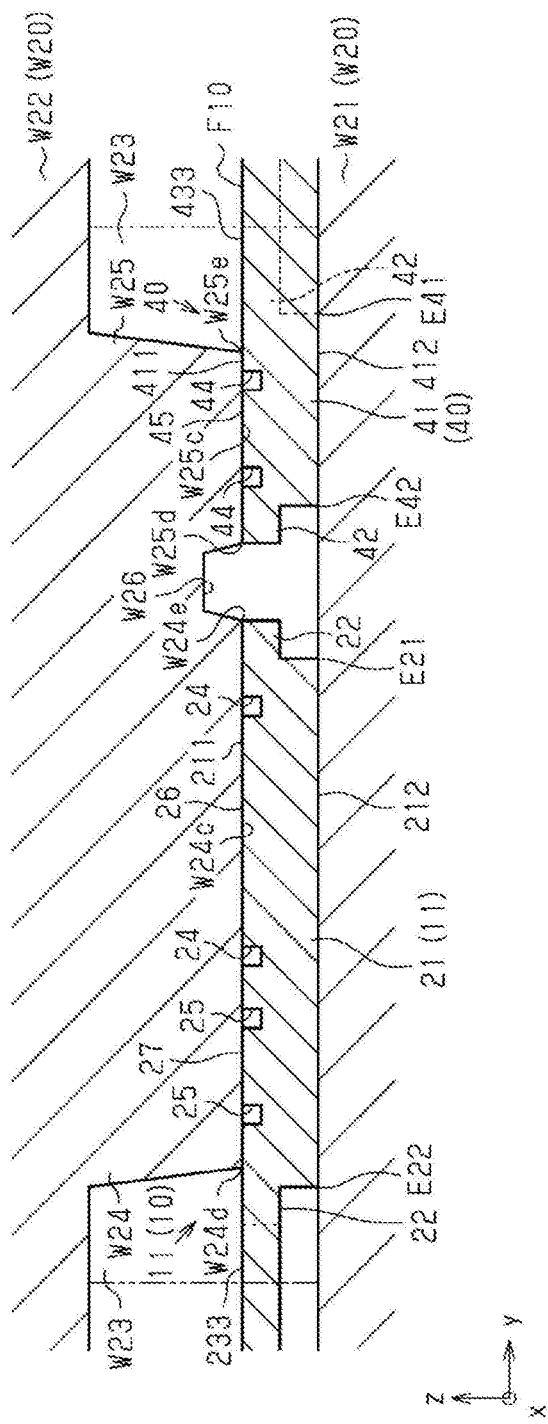
FIG. 16 is a schematic cross-sectional view showing a lead frame and a mold.

As shown in FIGS. 15 and 16, in the first convex portion W24, an end portion W24d on the side opposite to the sub lead 40 contacts the main surface 211 of the main body portion 21 inside the end portion E22 of the main body portion 21 of the first element mounting portion 11. The first element mounting portion 11 of the lead frame F10 is sandwiched between the first convex portion W24 of the upper mold W22 and the lower mold W21. Accordingly, in the end portion W24d, it is difficult to form a gap between the contact surface W24c of the first convex portion W24 and the main surface 211 of the main body portion 21 of the first element mounting portion 11, and it is difficult for the resin material forming the case 70 to enter.

As shown in FIG. 16, the first element mounting portion 11 is provided with the grooves 24 and 25 recessed from the main surface 211 of the main body portion 21. As shown in FIG. 1, the inside of the groove 24 is the die bonding portion 26, and the inside of the groove 25 is the wire bonding portion 27. Even if the resin material enters between the first convex portion W24 and the first element mounting portion 11, the resin material enters the grooves 24 and 25 recessed from the main surface 211, and hardly enters the die bonding portion 26 and the wire bonding portion 27.

In addition, as shown in FIG. 15, in the first convex portion W24, an end portion W24e on the sub lead 40 side contacts the edge portion 22 of the first element mounting portion 11. Since the contact surface W24c of the first convex portion W24 is in contact with the main surface 211 of the main body portion 21 of the first element mounting portion 11, it is difficult to form a gap between the first convex portion W24 and the edge portion 22, and it is difficult for the resin material to enter.

As shown in FIG. 16, in the second convex portion W25, an end portion W25e on the side opposite to the main lead 10 contacts the main surface 411 of the main body portion 41 inside the end portion E41 of the sub lead 40. The sub lead 40 is sandwiched between the second convex portion W25 of the upper mold W22 and the lower mold W21. Accordingly, in the end portion W25e, it is difficult to form a gap between the contact surface W25c of the second convex portion W25 and the main surface 411 of the main body portion 41, and it is difficult for the resin material forming the case 70 to enter.

In addition, in the second convex portion W25, an end portion W25d on the main lead 10 side contacts the edge portion 42 of the sub lead 40. Since the contact surface W25c of the second convex portion W25 contacts the main surface 411 of the main body portion 41 of the sub lead 40, it is difficult to form a gap between the second convex portion W25 and the edge portion 42, and it is difficult for the resin material to enter.

When the resin material forming the case 70 enters between the contact surface W24c of the first convex portion W24 and the main surface 211 of the main body portion 21 of the main lead 10 and between the contact surface W25c of the second convex portion W25 and the main surface 411 of the main body portion 41 of the sub lead 40, the resin material becomes a thin resin burr. The resin burr covering the die bonding portion becomes a factor that hinders connection of the semiconductor light-emitting element 51 and the like. The resin burr covering the wire bonding portion becomes a factor that hinders wire connection and the like. Therefore, a step of removing the resin burr is required.

In the semiconductor light-emitting device A10 of the first embodiment, since the resin material hardly enters between the mold W20 and the lead frame F10, resin burrs hardly occur. Further, even if the resin material enters between the mold W20 and the lead frame F10, since the resin material enters the grooves 24, 25, and 44 formed in the lead frame F10, the resin material is prevented from entering the die bonding portion 26 and the wire bonding portion 27. Therefore, a step of removing the resin burr is not required.

As shown in FIG. 9, the semiconductor light-emitting element 51 is bonded to the die bonding portion 26 of the main lead 10 with the bonding material 551. The electrode 514 of the semiconductor light-emitting element 51 is connected to the first wire bonding portion 45 of the sub lead 40 by the wire 61. Many bonding materials 551 are used for bonding a semiconductor light-emitting element 51 having a large area. In a die bonding process, the bonding material 551 may flow out from the die bonding portion 26. If the bonding material 551 that has flowed out adheres to the first wire bonding portion 45 of the sub lead 40, the connection between the wire 61 and the first wire bonding portion 45 is affected, which may lead to a connection failure. In contrast, the semiconductor light-emitting device A10 of the first embodiment includes the wall portion 78 between the main lead 10 and the sub lead 40. The wall portion 78 protrudes from the main surfaces 101 and 401 of the main lead 10 and the sub lead 40 to the case main surface 701 side of the case 70. The wall portion 78 makes it difficult for the bonding material 551 to flow into the sub lead 40.

As shown in FIG. 9, the grooves 24 and 25 are formed in the main body portion 21 of the main lead 10. The inside of the groove 24 is the die bonding portion 26, and the inside of the groove 25 is the wire bonding portion 27. The semiconductor light-emitting element 51 is connected to the die bonding portion 26 by the bonding material 551. The bonding material 551 melted during connection may flow out from the die bonding portion 26. The bonding material 551 that has flowed out flows into the groove 24 formed around the die bonding portion 26. Therefore, the bonding material 551 hardly flows out of the groove 24. Further, the grooves 24 and 25 are formed between the die bonding portion 26 and the wire bonding portion 27. Accordingly, even if the bonding material 551 overflows from the groove 24, the bonding material 551 hardly flows into the wire bonding portion 27 by flowing into the groove 25.

As shown in FIGS. 7 and 9, the back surface 212 of the main body portion 21 on which the semiconductor light-emitting element 51 is mounted is exposed from the case back surface 702 of the case 70. Accordingly, the entire back surface 212 of the main body portion 21 contacts, for example, a mounting substrate on which the semiconductor light-emitting device A10 is mounted. The heat of the semiconductor light-emitting element 51 is transferred to the case back surface 702 side of the case 70 via the main body portion 21 and is dissipated to the mounting substrate.

As shown in FIGS. 6 and 8, the back surface 312 of the main body portion 31 with the main surface 311 on which the protective element 52 is mounted is exposed from the case back surface 702 of the case 70. Accordingly, the entire back surface 312 of the main body portion 31 contacts, for example, the mounting substrate on which the semiconductor light-emitting device A10 is mounted. The heat of the protective element 52 is transferred to the case back surface 702 side of the case 70 via the main body portion 31 and is dissipated to the mounting substrate.

As shown in FIG. 1, in the semiconductor light-emitting device A10 of the first embodiment, the protective element 52 is mounted on the second element mounting portion 12 of the main lead 10 and is covered with the case 70. The protective element 52 may absorb light emitted from the semiconductor light-emitting element 51. Accordingly, by covering the protective element 52 with the case 70, the upward emission efficiency of the semiconductor light-emitting device A10 is improved.

As shown in FIGS. 5, 7, and 9, the first element mounting portion 11 of the main lead 10 includes the main body portion 21 and the edge portion 22 at the end portion of the main body portion 21. The thickness of the edge portion 22 is thinner than the thickness of the main body portion 21, and in the thickness direction z, the main surface 221 of the edge portion 22 is at the same position as the main surface 211 of the main body portion 21, and the back surface 222 of the edge portion 22 is located closer to the main surface 211 of the main body portion 21 than the back surface 212 of the main body portion 21. The back surface 212 of the main body portion 21 is flush with the case back surface 702 of the case 70. Accordingly, the case 70 covers the back surface 222 of the edge portion 22. As shown in FIGS. 5, 6, and 8, the second element mounting portion 12 of the main lead 10 includes the main body portion 31 and the edge portion 32 thinner than the main body portion 31. The relationship between the main body portion 31 and the edge portion 32 is the same as that of the first element mounting portion 11. This makes it difficult for the main lead 10 to fall out of the case 70.

As shown in FIGS. 5, 6, and 9, the sub lead 40 includes the main body portion 41 and the edge portion 42 at the end portion of the main body portion 41. The thickness of the edge portion 42 is smaller than the thickness of the main body portion 41, and in the thickness direction z, the main surface 421 of the edge portion 42 is at the same position as the main surface 411 of the main body portion 41, and the back surface 422 of the edge portion 42 is located closer to the main surface 411 of the main body portion 41 than the back surface 412 of the main body portion 41. The back surface 412 of the main body portion 41 is flush with the case back surface 702 of the case 70. Accordingly, the case 70 covers the back surface 422 of the edge portion 42. This makes it difficult for the sub lead 40 to fall out of the case 70.

As described above, the semiconductor light-emitting device A10 of the first embodiment has the following effects.

(1-1) The case 70 includes the wall portion 78 interposed between the main lead 10 and the sub lead 40. The wall portion 78 protrudes from the main surfaces 101 and 401 of the main lead 10 and the sub lead 40 to the case main surface 701 side of the case 70. The semiconductor light-emitting element 51 is bonded to the die bonding portion 26 of the main lead 10 by the bonding material 551. The electrode 514 of the semiconductor light-emitting element 51 is connected to the first wire bonding portion 45 of the sub lead 40 by the wire 61.

Many bonding materials 551 are used for bonding the semiconductor light-emitting element 51 having a large area. In the die bonding process, the bonding material 551 may flow out from the die bonding portion 26. In the wall portion 78 of the first embodiment, the bonding material 551 flowing out from the main lead 10 is blocked by the wall portion 78 so as not to flow into the sub lead 40. Accordingly, it is possible to prevent the bonding material 551 from flowing into the sub lead 40. Therefore, the bondability of the wire 61 to the sub lead 40 can be secured.

(1-2) The first element mounting portion 11 of the main lead 10 includes the main body portion 21 with the main surface 211 on which the semiconductor light-emitting element 51 is mounted. The back surface 212 of the main body portion 21 is exposed from the case back surface 702 of the case 70. Accordingly, the entire back surface 212 of the main body portion 21 contacts, for example, the mounting substrate on which the semiconductor light-emitting device A10 is mounted. The heat of the semiconductor light-emitting element 51 is transferred to the case back surface 702 side of the case 70 via the main body portion 21 and is dissipated to the mounting substrate. Accordingly, the heat dissipation of the semiconductor light-emitting element 51 can be secured.

(1-3) The back surface 212 of the main body portion 21 is exposed from the case back surface 702 of the case 70 and is flush with the case back surface 702. Accordingly, when the lead frame F10 formed thereon with the case 70 is placed on the work table of the die bonder, the back surface 212 of the main body portion 21 contacts the work table. Accordingly, the pressing force applied by the die bonding is received by the work table. Therefore, the semiconductor light-emitting element 51 can be reliably mounted on the first element mounting portion 11.

(1-4) The semiconductor light-emitting element 51 is connected to the first wire bonding portion 45 of the sub lead 40 by the wire 61. In the sub lead 40, the back surface 412 of the main body portion 41 facing the side opposite to the first wire bonding portion 45 is exposed from the case back surface 702 of the case 70 and is flush with the case back surface 702. The lead frame F10 formed thereon with the case 70 is placed on the work table of the wire bonder. Accordingly, the pressing force applied by the wire bonding is received by the work table. Therefore, the wire 61 is reliably connected to the first wire bonding portion 45 of the sub lead 40. Further, the wire 61 is reliably connected to the semiconductor light-emitting element 51.

(1-5) The second element mounting portion 12 of the main lead 10 includes the main body portion 31 with the main surface 311 on which the protective element 52 is mounted. The back surface 312 of the main body portion 31 is exposed from the case back surface 702 of the case 70. Accordingly, the entire back surface 312 of the main body portion 31 contacts, for example, a device on which the protective element 52 is mounted. Therefore, the bondability of the protective element 52 to the main lead 10 can be secured. Further, the entire back surface 312 of the main body portion 31 contacts, for example, a mounting substrate on which the semiconductor light-emitting device A10 is mounted. The heat of the protective element 52 is transferred to the case back surface 702 side of the case 70 via the main body portion 31 and is dissipated to the mounting substrate. Accordingly, the heat dissipation of the protective element 52 can be secured.

(1-6) As described above, the main body portion 31 has the thickness of the lead frame F10. Accordingly, the wire 63 can be reliably connected to the protective element 52.

(1-7) The protective element 52 is connected to the sub lead 40 by the wire 63. The second wire bonding portion 46 of the sub lead 40 has the thickness of the lead frame F10. Accordingly, the wire 63 can be reliably connected to the sub lead 40.

(1-8) The main opening 71 exposing a portion of the main surface 111 of the first element mounting portion 11 of the main lead 10 is partitioned by the main inner side surface 73 formed in the case 70. Of the main inner side surface 73, in the second main inner side surface 732, the third main inner side surface 733, and the fourth main inner side surface 734 excluding the first main inner side surface 731 facing the side opposite to the sub lead 40, the end portions 732b, 733b, and 734b on the main lead 10 side are located inside the main body portion 21 closer than the end portions E22, E23, and E24 of the main body portion 21 of the first element mounting portion 11.

The main inner side surface 73 is formed by the first convex portion W24 of the mold W20 (the upper mold W22) forming the case 70. The main lead 10 is sandwiched between the first convex portion W24 and the lower mold W21, and the case 70 is molded by the resin material injected into the space (cavity) W23 in the mold W20.

The contact surface W24c of the first convex portion W24 contacts the main surface 211 of the main body portion 21 inside the end portions E22, E23, and E24 of the main body portion 21. Accordingly, it is difficult to form a gap between the contact surface W24c of the first convex portion W24 and the main surface 211 of the main body portion 21 which is the main surface of the first element mounting portion 11, and it is difficult for the resin material forming the case 70 to enter. Therefore, it is possible to suppress the generation of a thin resin burr that covers the main surface of the first element mounting portion 11. When the resin burr is generated, a step of removing the resin burr is required, which increases the time required for manufacture. In contrast, the semiconductor light-emitting device A10 of the first embodiment can suppress an increase in the time required for manufacture.

(1-9) The first element mounting portion 11 of the main lead 10 includes the groove 24 recessed from the main surface 211 of the main body portion 21. The groove 24 is formed in an annular shape, and the inside thereof is the die bonding portion 26. Even if the resin material that forms the case 70 enters between the first convex portion W24 of the upper mold W22 forming the case 70 and the first element mounting portion 11, the resin material enters the groove 24 recessed from the main surface 211 and hardly enters the die bonding portion 26. Therefore, it is possible to prevent the generation of the resin burr that covers the die bonding portion 26.

(1-10) The sub opening 72 exposing a portion of the main surface 401 of the sub lead 40 is partitioned by the main inner side surface 73 formed in the case 70. The sub inner side surface 74 includes the first sub inner side surface 741, the second sub inner side surface 742, and the third sub inner side surface 743. In the first sub inner side surface 741, the second sub inner side surface 742, and the third sub inner side surface 743, the end portions 741b, 742b, and 743b on the sub lead 40 side are located inside the main body portion 41 closer than the end portions E41, E43, and E44 of the main body portion 41 of the sub lead 40.

The sub inner side surface 74 is formed by the second convex portion W25 of the upper mold W22 that forms the case 70. The sub lead 40 is sandwiched between the second convex portion W25 and the lower mold W21. The contact surface W25c of the second convex portion W25 contacts the main surface 411 of the main body portion 41 inside the end portions E41, E43, and E44 of the main body portion 41 of the sub lead 40. Accordingly, it is difficult to form a gap between the contact surface W25c of the second convex portion W25 and the main surface 411 of the main body portion 41, and it is difficult for the resin material forming the case 70 to enter. Therefore, the generation of a thin resin burr that covers the main surface 411 of the main body portion 41 can be suppressed.

(1-11) The sub lead 40 is formed with the groove 44 recessed from the main surface 411 of the main body portion 41. The inside of the groove 44 is the first wire bonding portion 45. Even if the resin material enters between the second convex portion W25 and the sub lead 40, the resin material enters the groove 44 recessed from the main surface 411 and hardly enters the first wire bonding portion 45. Therefore, it is possible to prevent the generation of a resin burr that covers the first wire bonding portion 45.

(1-12) The protective element 52 is mounted on the second element mounting portion 12 of the main lead 10 and is covered with the case 70. The protective element 52 may absorb light emitted from the semiconductor light-emitting element 51. Accordingly, by covering the protective element 52 with the case 70, the upward emission efficiency of the semiconductor light-emitting device A10 can be improved.

(1-13) The first element mounting portion 11 of the main lead 10 includes the main body portion 21 and the edge portion 22. The thickness of the edge portion 22 is thinner than the thickness of the main body portion 21, and the back surface 222 of the edge portion 22 is covered with the case 70. The second element mounting portion 12 of the main lead 10 includes the main body portion 31 and the edge portion 32. The thickness of the edge portion 32 is thinner than the thickness of the main body portion 31, and the back surface 322 of the edge portion 32 is covered with the case 70. Accordingly, the main lead 10 can be prevented from falling out of the case 70.

(1-14) The sub lead 40 includes the main body portion 41 and the edge portion 42. The thickness of the edge portion 42 is thinner than the thickness of the main body portion 41, and the back surface 422 of the edge portion 42 is covered with the case 70. Accordingly, the sub lead 40 can be prevented from falling out of the case 70.

(1-15) The main lead 10 includes the extension portions 231 to 234 and 331 to 333, and the sub lead 40 includes the extension portions 431 to 433. The extension portions 231 to 234, 331 to 333, and 431 to 433 are connected by the connecting portions C11 to C15 in the lead frame F10 including the main lead 10 and the sub lead 40. The plurality of main leads 10 and sub leads 40 included in the lead frame F10 are connected to the extension portions 231 to 234, 331 to 333, and 431 to 433 by the connecting portions C11 to C15 in the first direction y and the second direction x. Accordingly, the bending of the lead frame F10 and the like can be suppressed. Moreover, since all of the main leads 10 and the sub leads 40 are connected, the plating properties for the main leads 10 and the sub leads 40 can be improved.

(1-16) The semiconductor light-emitting element 51 is connected to the wire bonding portion 27 of the first element mounting portion 11 by the wire 62. The back surface 212 of the main body portion 21 facing the side opposite to the wire bonding portion 27 is exposed from the case back surface 702 of the case 70 and is flush with the case back surface 702. Accordingly, the pressing force applied by the wire bonding is received by the work table. Therefore, the wire 62 is reliably connected to the wire bonding portion 27 of the first element mounting portion 11. Moreover, the wire 62 can be reliably connected to the semiconductor light-emitting element 51.

(1-17) The first element mounting portion 11 is formed with the groove 25 recessed from the main surface 211 of the main body portion 21. The inside of the groove 25 is the wire bonding portion 27. Even if the resin material enters between the first convex portion W24 of the upper mold W22 forming the case 70 and the first element mounting portion 11, the resin material enters the groove 25 recessed from the main surface 211 and hardly enters the wire bonding portion 27. Therefore, it is possible to prevent the generation of a resin burr that covers the wire bonding portion 27.

(1-18) In the first element mounting portion 11 of the main lead 10, the wire bonding portion 27 for the wire 62 connected to the semiconductor light-emitting element 51 is provided on the opposite side of the sub lead 40 with respect to the die bonding portion 26 on which the semiconductor light-emitting element 51 is mounted. Accordingly, the first element mounting portion 11 of the main lead 10 is provided with the die bonding portion 26 at approximately the center of the case 70. In this way, the semiconductor light-emitting device A10 can cause the semiconductor light-emitting element 51 to emit light in substantially the center of the case 70.

Second Embodiment

Figure 17:
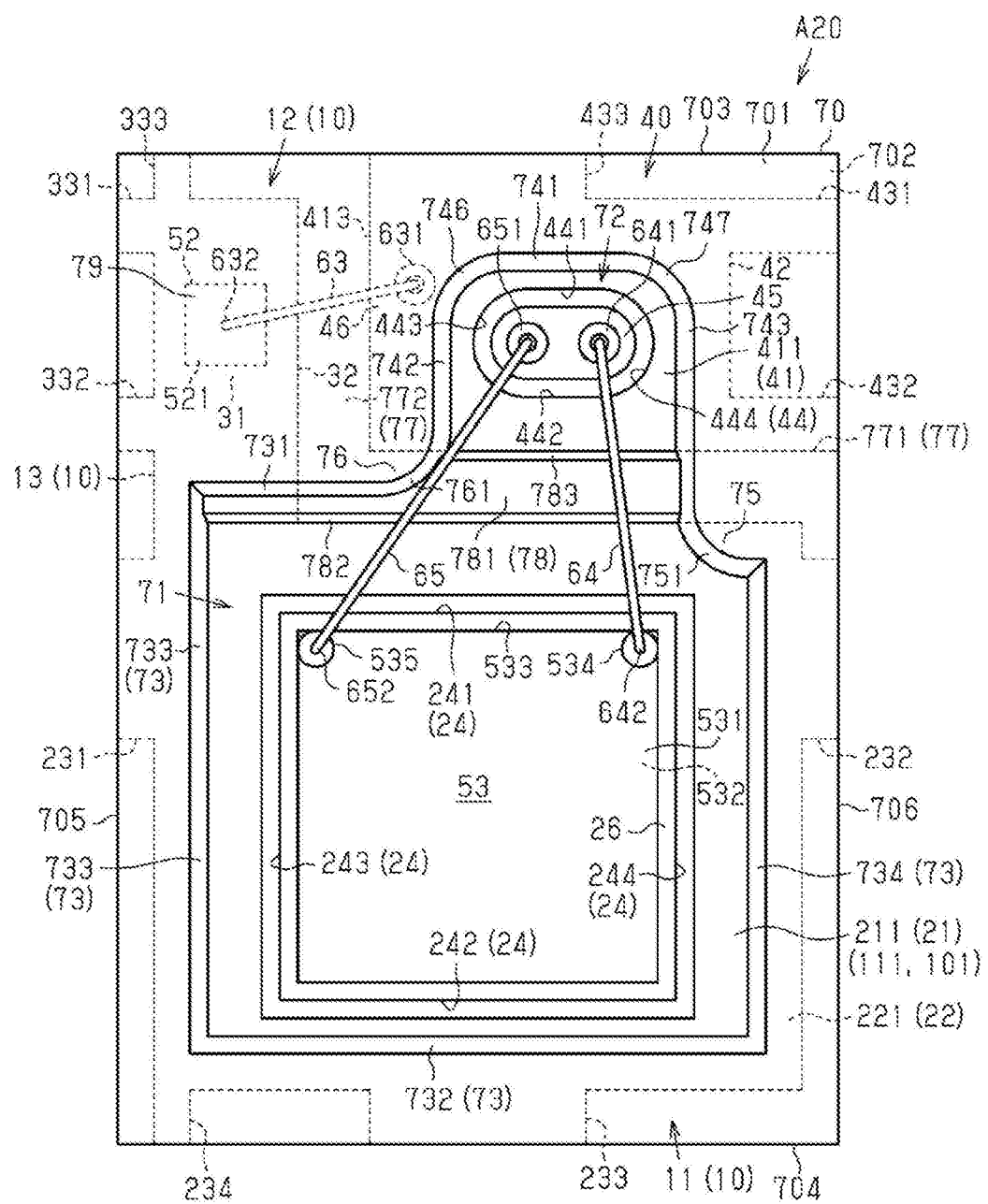
FIG. 17 is a schematic plan view of a semiconductor light-emitting device according to a second embodiment.

A semiconductor light-emitting device A20 according to a second embodiment will be now described with reference to FIG. 17. In the semiconductor light-emitting device A20 of the second embodiment, the same constituent members as those of the semiconductor light-emitting device A10 of the first embodiment are denoted by the same reference numerals, and some or all explanations thereof will be omitted.

The semiconductor light-emitting device A20 of the second embodiment differs from the semiconductor light-emitting device A10 of the first embodiment in a semiconductor light-emitting element 53. Further, depending on the semiconductor light-emitting element 53 to be mounted, the groove 25 and the wire bonding portion 27 shown in FIG. 1 are not formed in the main lead 10.

In the main lead 10 of the second embodiment, the main body portion 21 of the first element mounting portion 11 includes one groove 24 recessed from the main surface 211. The groove 24 includes the groove portions 241 and 242 extending in the second direction x and the groove portions 243 and 244 extending in the first direction y. The groove portion 241 extends along the wall portion 78, and the groove portion 242 extends along the second main inner side surface 732. The groove portion 243 extends along the third main inner side surface 733, and the groove portion 244 extends along the fourth main inner side surface 734. Each of the groove portions 241 to 244 extends longer than each side of the semiconductor light-emitting element 53 mounted on the main lead 10. That is, the groove 24 is formed in a rectangular shape corresponding to the size of the semiconductor light-emitting element 53. The inside of this rectangular groove 24 becomes the die bonding portion 26. The depth of the groove 24 is, for example, about 50 μm.

The semiconductor light-emitting element 53 is, for example, a light-emitting diode (LED) element. The semiconductor light-emitting element 53 of the second embodiment includes electrodes on a main surface 531 and a back surface 532 that face opposite sides. The semiconductor light-emitting element 53 is formed in a rectangular shape when viewed from the thickness direction z. The semiconductor light-emitting element 53 includes the main surface 531 and the back surface 532. The semiconductor light-emitting element 53 includes electrodes 534 and 535 near both ends of one side of the main surface 531 along one side surface 533. The electrodes 534 and 535 are, for example, anode electrodes. The semiconductor light-emitting element 53 includes an electrode on the back surface 532. The electrode on the back surface 532 is, for example, a cathode electrode.

The semiconductor light-emitting element 53 is disposed on the die bonding portion 26 of the main body portion 21 of the first element mounting portion 11 with the side surface 533 on the side where the electrodes 534 and 535 are provided facing the sub lead 40. Then, the electrode on the back surface 532 is connected to the die bonding portion 26 by a bonding material (not shown) having conductivity. As the bonding material, for example, solder or Ag paste can be used. The electrodes 534 and 535 of the main surface 531 are connected to second ends 642 and 652 of wires 64 and 65, respectively, and first ends 641 and 651 of the wires 64 and 65 are connected to the first wire bonding portion 45 of the sub lead 40. In the wires 64 and 65, the first ends 641 and 651 are the first bonding portions in the wire bonding process, and the second ends 642 and 652 are the second bonding portions.

(Operation)

Next, the operation of the semiconductor light-emitting device A20 of the second embodiment will be described. The semiconductor light-emitting element 53 mounted on the semiconductor light-emitting device A20 of the second embodiment includes a plurality of electrodes 534 and 535 on the main surface 531 and an electrode on the back surface 532. The electrode on the back surface 532 is connected to the main body portion 21 of the main lead 10 via a conductive bonding material. Therefore, the wire 62 that connects the semiconductor light-emitting element 51 and the main lead 10 in the semiconductor light-emitting element 51 of the first embodiment becomes unnecessary. That is, the wire bonding portion 27 becomes unnecessary in the main lead 10. Therefore, the die bonding portion 26 on the main surface 211 of the main body portion 21 of the main lead 10 can be made larger than that in the first embodiment. That is, the semiconductor light-emitting element 53 larger than that in the first embodiment can be mounted. Accordingly, the light amount of the semiconductor light-emitting device A20 can be increased.

The semiconductor light-emitting element 53 extends in the first direction y to the vicinity of the second main inner side surface 732 on the case outer side surface 704 side of the case 70. Therefore, it is possible to emit light in almost the entire main opening 71.

When a large semiconductor light-emitting element 53 is used, since the bonding material of an amount corresponding to the large semiconductor light-emitting element 53 is applied to the die bonding portion 26, the bonding material flows out more easily. The semiconductor light-emitting device A20 of the second embodiment includes the wall portion 78 as in the semiconductor light-emitting device A10 of the first embodiment. The wall portion 78 prevents the bonding material from flowing from the die bonding portion 26 of the main lead 10 into the first wire bonding portion 45 of the sub lead 40.

In the semiconductor light-emitting element 53, the electrodes 534 and 535 on the main surface 531 are connected to the first wire bonding portion 45 of the sub lead 40 via the wires 64 and 65, respectively. By using the two wires 64 and 65 in this manner, a current is dispersed and supplied to the semiconductor light-emitting element 53. In the sub lead 40, the two wires 64 and 65 can be easily connected by forming the first wire bonding portion 45 that is long in the second direction x. Note that one of the wires, for example, the wire 65, may be omitted depending on the amount of current supplied to the semiconductor light-emitting element 53.

In the case 70, a space between the first main inner side surface 731 that defines the main opening 71 and the second sub inner side surface 742 that defines the sub opening 72 has a side surface 761 of a quarter annular shape when viewed in the thickness direction z. Accordingly, as compared with the case where the first main inner side surface 731 and the second sub inner side surface 742 are connected at a right angle, the wire 65 can be linearly arranged without interference between the case 70 and the wire 65, thereby preventing the wire 65 from becoming longer than necessary.

That is, by using the semiconductor light-emitting element 53 having a large area of the main surface 531, of the plurality of wires 64 and 65 connected to the first wire bonding portion 45 exposed by the sub opening 72 biased from the center of the case 70 to the one case outer side surface 706 side with respect to the semiconductor light-emitting element 53, the wire 65 connected to the electrode 535 in the direction opposite to the bias direction and the case 70 can be prevented from interfering with each other.

As described above, according to the semiconductor light-emitting device A20 of the second embodiment, the following effects are obtained in addition to (1-1) to (1-15) of the first embodiment.

(2-1) The semiconductor light-emitting element 53 of the second embodiment includes the electrodes 534 and 535 on the main surface 531 and the electrode on the back surface 532, and the electrode on the back surface 532 is connected to the first element mounting portion 11 of the main lead 10 by the bonding material. Since a large amount of bonding material is applied to the first element mounting portion 11 for connection of the large semiconductor light-emitting element 53, the bonding material flows out easily. The wall portion 78 is provided between the main lead 10 and the sub lead 40. Therefore, even when the semiconductor light-emitting element 53 having a large area is mounted, the wall portion 78 can prevent the bonding material from flowing from the main lead 10 into the sub lead 40.

(2-2) A large semiconductor light-emitting element 53 can be mounted, and the light amount of the semiconductor light-emitting device A20 can be increased.

(2-3) In the semiconductor light-emitting element 53, the electrodes 534 and 535 on the main surface 531 are connected to the first wire bonding portion 45 of the sub lead 40 via the wires 64 and 65, respectively. This allows a current to be distributed and supplied to the semiconductor light-emitting element 53.

(2-4) In the sub lead 40, the two wires 64 and 65 can be easily connected by forming the first wire bonding portion 45 that is long in the second direction x.

(2-5) Using the large semiconductor light-emitting element 53, interference between the wire 65 connected to the electrode 535 on the side opposite to the case outer side surface 706 side on which the first wire bonding portion 45 is biased in the semiconductor light-emitting element 53 and the case 70 can be prevented, so that the wire 65 can be linearly arranged.

Third Embodiment

A semiconductor light-emitting device A30 according to a third embodiment will now be described with reference to FIGS. 18 to 20. In the semiconductor light-emitting device A30 of the third embodiment, the same constituent members as those of the semiconductor light-emitting device A10 of the first embodiment and the semiconductor light-emitting device A20 of the second embodiment are denoted by the same reference numerals, and some or all explanations thereof will be omitted.

The semiconductor light-emitting device A30 of the third embodiment is not provided with the protective element 52, unlike the semiconductor light-emitting device A20 of the second embodiment. Therefore, the main lead 10 does not include the second element mounting portion 12 and the connecting portion 13. Accordingly, the shape of the sub lead 40 is different from that of the above-described embodiments.

Figure 18:
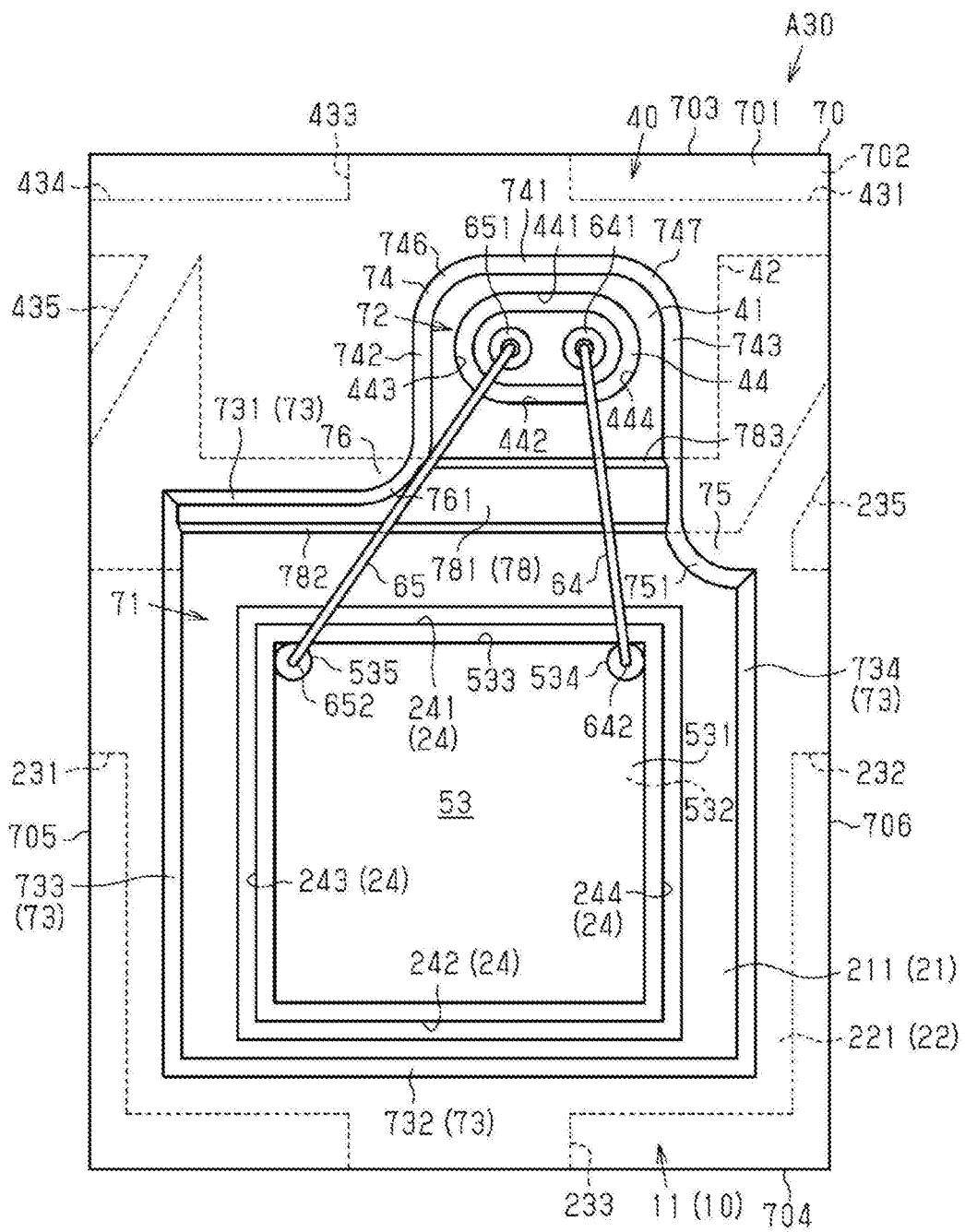
FIG. 18 is a schematic plan view of a semiconductor light-emitting device according to a third embodiment.
Figure 19:
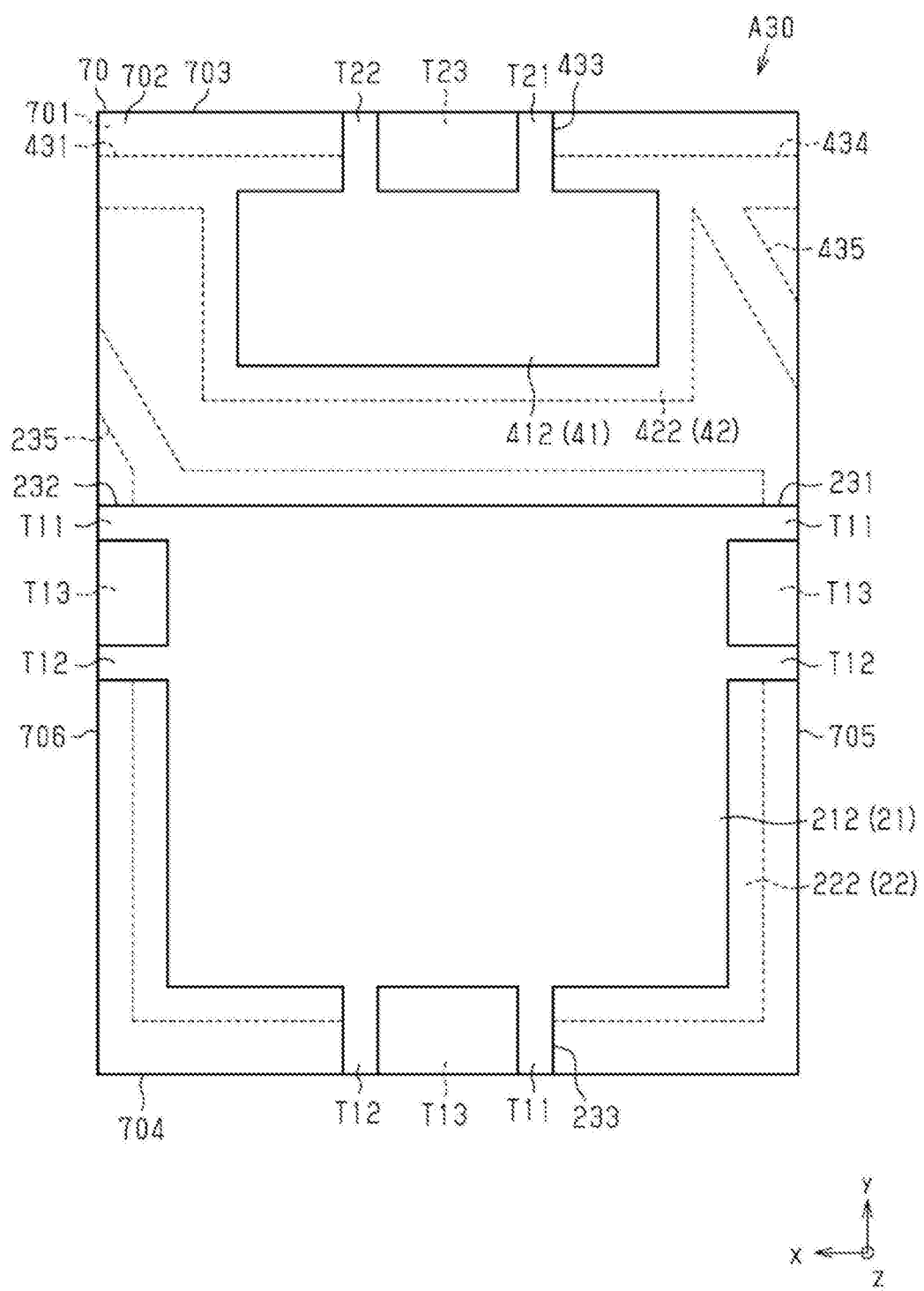
FIG. 19 is a schematic bottom view of the semiconductor light-emitting device according to the third embodiment.

As shown in FIGS. 18 and 19, the semiconductor light-emitting device A30 includes a main lead 10, a sub lead 40, a semiconductor light-emitting element 51, wires 61 and 62, a case 70, and a sealing member 90.

The main lead 10 is composed of a first element mounting portion 11. The main lead 10 includes a main body portion 21, an edge portion 22, and extension portions 231, 232, 233 and 235. The main body portion 21 includes a groove 24 recessed from a main surface 211 toward a back surface 212. The groove 24 is composed of groove portions 241, 242, 243, and 244.

The extension portions 231 and 232 extend in opposite directions from the end portions on both sides of the main body portion 21 in the second direction x. The extension portions 231 and 232 are arranged at positions overlapping with each other when viewed from the second direction x. The extension portion 233 extends along the first direction y from the end portion E22 on the opposite side of the sub lead 40 in the main body portion 21. The extension portion 233 is arranged at the center of the main body portion 21 in the second direction x.

The extension portion 235 extends outward from the edge portion 22. The extension portion 235 extends from the one end portion of the edge portion 22 in the second direction x, obliquely with respect to the second direction x and the first direction y. The thickness of the extension portion 235 is equal to the thickness of the edge portion 22.

As shown in FIGS. 18 and 19, the sub lead 40 includes a main body portion 41, an edge portion 42, and extension portions 431, 433, 434, and 435. The main body portion 41 has a rectangular plate shape that is long in the second direction x when viewed from the thickness direction z. As shown in FIG. 19, in the third embodiment, the main body portion 41 is arranged at the center of the case 70 in the second direction x. The edge portion 42 is provided along the periphery of the main body portion 41.

The extension portion 433 extends in the first direction y from the end portion E41 of the main body portion 41 opposite to the main lead 10. The extension portion 433 is arranged at a position overlapping the extension portion 233 of the main lead 10 in the first direction y. The extension portions 431 and 434 extend from the end portion on the opposite side of the main lead 10 at the edge portion 42 to the opposite sides along the second direction x. The extension portions 431 and 434 are arranged at positions overlapping with each other when viewed from the second direction x.

The extension portion 435 extends from the end portion of the edge portion 42 on the side opposite to the end portion of the main lead 10 on which the extension portion 235 is provided in the second direction x, obliquely with respect to the first direction y and the second direction x. In the third embodiment, the extension portion 435 extends from the base portion of the extension portion 434 obliquely at a predetermined angle with respect to the second direction x. The extension portion 435 extends in a direction opposite to the extension direction of the extension portion 235 of the main lead 10.

(Operation)

Next, the operation of the semiconductor light-emitting device A30 of the third embodiment will be described. As shown in FIG. 20, the semiconductor light-emitting device A30 of the third embodiment is formed using a lead frame F30 including the main lead 10 and the sub lead 40.

Figure 20:
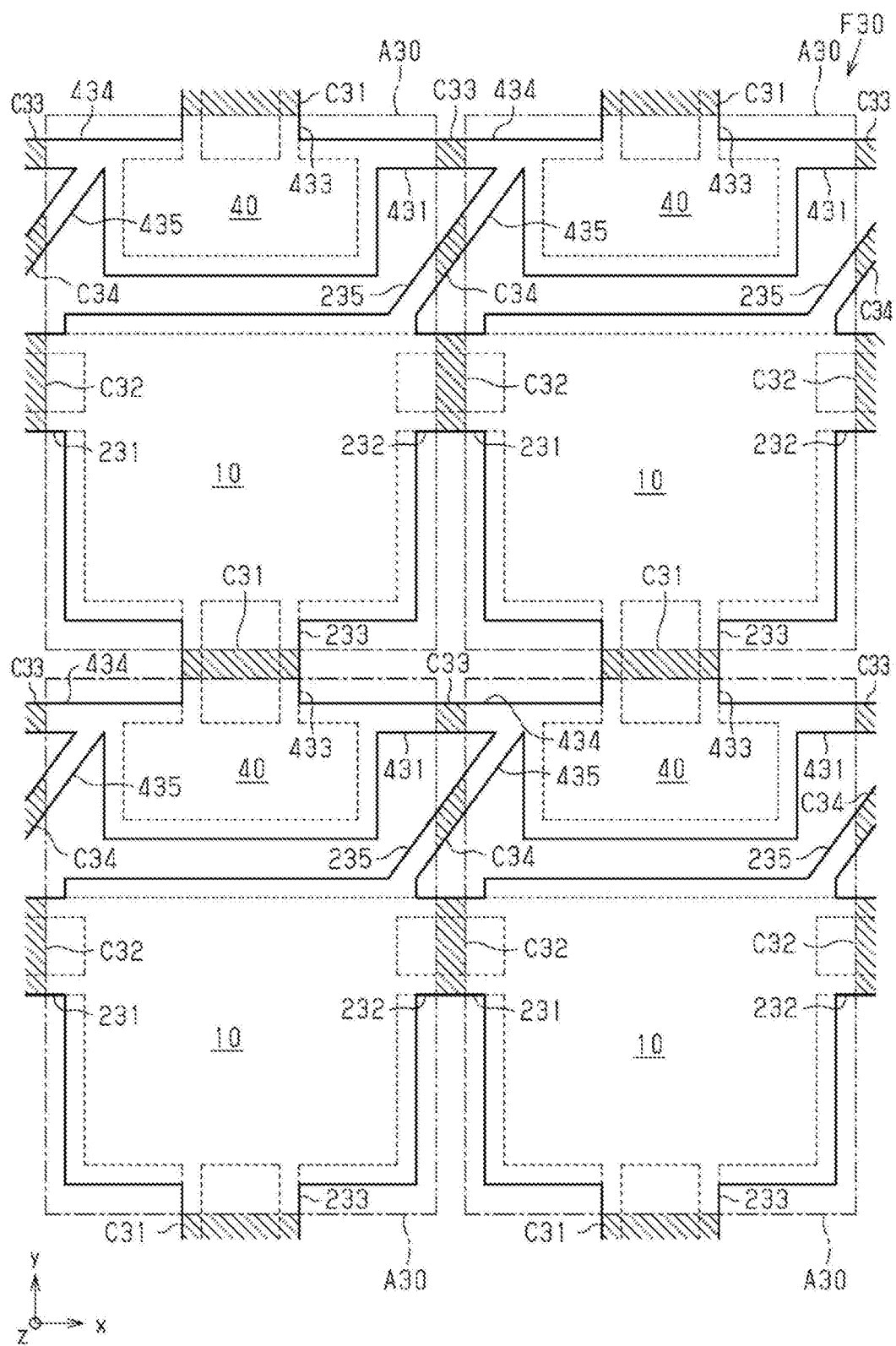
FIG. 20 is a plan view showing a portion of a lead frame for the semiconductor light-emitting device according to the third embodiment.

FIG. 20 shows a portion of the lead frame F30 for manufacturing the semiconductor light-emitting device A30 of the third embodiment. In addition, FIG. 20 shows a portion for manufacturing four semiconductor light-emitting devices A30 (shown by dash-dotted lines in the figure) adjacent to each other in the first direction y and the second direction x.

Each of the semiconductor light-emitting devices A30 formed adjacent to each other in the first direction y and the second direction x includes the main lead 10 and the sub lead 40. The lead frame F30 includes a base material forming the main lead 10 and the sub lead 40. The lead frame F30 is produced, for example, by etching or pressing a metal plate made of Cu, Ni, or an alloy containing at least one selected from the group thereof. Members that form the lead frame F30 will be described using the names and reference numerals of the members that will eventually become the semiconductor light-emitting device A30.

As shown in FIG. 20, the main lead 10 and the sub lead 40 that form the semiconductor light-emitting device A30 are connected to adjacent main leads 10 and sub leads 40 by connecting portions C31 to C34. In FIG. 20, the connecting portions C31 to C34 are hatched to facilitate understanding. The connecting portions C31 to C34 are portions that are removed by, for example, dicing when dividing the semiconductor light-emitting device A30 into individual pieces.

The extension portion 233 of the main lead 10 and the extension portion 433 of the sub lead 40 adjacent to the main lead 10 in the first direction y are connected to each other by the connecting portion C31. That is, in the first direction y, the adjacent main lead 10 and sub lead 40 are connected to each other by the connecting portion C31.

The extension portion 232 of the main lead 10 and the extension portion 231 of the main lead 10 adjacent to the main lead 10 in the second direction x are connected to each other by the connecting portion C32. In addition, the extension portion 431 of the sub lead 40 and the extension portion 434 of the sub lead 40 adjacent to each other in the second direction x are connected to each other by the connecting portion C33. That is, the main leads 10 arranged in the second direction are connected by the connecting portion C32. Further, the sub leads 40 arranged in the second direction are connected by the connecting portion C33.

In the third embodiment, the main lead 10 includes the extension portion 235 extending obliquely with respect to the first direction y and the second direction x, and the sub lead 40 includes the extension portion 435 extending in a direction opposite to the extension portion 235 of the main lead 10. In the lead frame F30, the extension portions 235 and 435 are connected to each other by the connecting portion C34. That is, the connecting portion C34 connects the main lead 10 and the sub lead 40 of the semiconductor light-emitting device A30 formed adjacent to the semiconductor light-emitting device A30 including the main lead 10 in the second direction x.

That is, in the third embodiment, the lead frame includes a row of main leads 10 arranged along the second direction x and connected by the connecting portion C32, and a row of sub leads 40 arranged along the second direction x and connected by the connecting portion C33. The row of main leads 10 and the row of sub leads 40 are alternately arranged in the first direction y and are connected to each other by the connecting portions C31 and C34. With such a configuration, bending of the lead frame F30 is suppressed, and the lead frame F30 can be easily transported. Further, since all of the main leads 10 and the sub leads 40 are connected, a plating layer can be easily formed on the surfaces of the main leads 10 and the sub leads 40 by an electrolytic plating method or the like.

In the case 70, by making the shapes of the main opening 71, the sub opening 72, and the wall portion 78 the same as those in the first and second embodiments, the mold W20 (see FIGS. 13 to 16) used to form the case 70 in the first embodiment can be used. The case 70 of the third embodiment can be formed by sandwiching the lead frame F30 of the third embodiment shown in FIG. 20 between the lower mold W21 and the upper mold W22 of the mold W20 shown in FIGS. 13 to 16 and injecting the resin material into the space W23 in the mold W20. As a result, the semiconductor light-emitting device A30 of the third embodiment can be obtained without manufacturing a new mold.

As described above, according to the semiconductor light-emitting device A30 of the third embodiment, the following effects are obtained in addition to the effects of the first and second embodiments.

(3-1) The main lead 10 includes the extension portions 231 to 233 and 235, and the sub lead 40 includes the extension portions 431 and 433 to 435. The extension portions 231 to 233, 235, 431, and 433 to 435 are connected by the connecting portions C31 to C34 in the lead frame F30 including the main leads 10 and the sub leads 40. The main leads 10 and the sub leads 40 included in the lead frame F30 are connected in a row in the second direction x, and the row of main leads 10 and the row of sub leads 40 are connected to each other. This can prevent the lead frame F30 from being bent and the like. Moreover, since all of the main leads 10 and the sub leads 40 are connected, the plating properties for the main leads 10 and the sub leads 40 can be improved.

(3-2) In the semiconductor light-emitting device A30, the main lead 10 and the sub lead 40 are exposed on the case back surface 702 of the case 70 so as to be line-symmetric with respect to the second direction x. Accordingly, the design (shape) of connecting pads in a circuit board on which the semiconductor light-emitting device A30 is mounted becomes easy. Further, the exposed portions of the main lead 10 and the sub lead 40 are not biased in the second direction x with respect to the outer shape of the case 70 of the semiconductor light-emitting device A30, and the mountability is improved.

(Modifications)

The above-described embodiments can be modified and implemented as follows. The above-described embodiments and the following modifications can be implemented in combination unless technically contradictory. In addition, in the following modifications, the same constituent members as those in the above-described embodiments are denoted by the same reference numerals, and some or all explanations thereof will be omitted.

Figure 21:
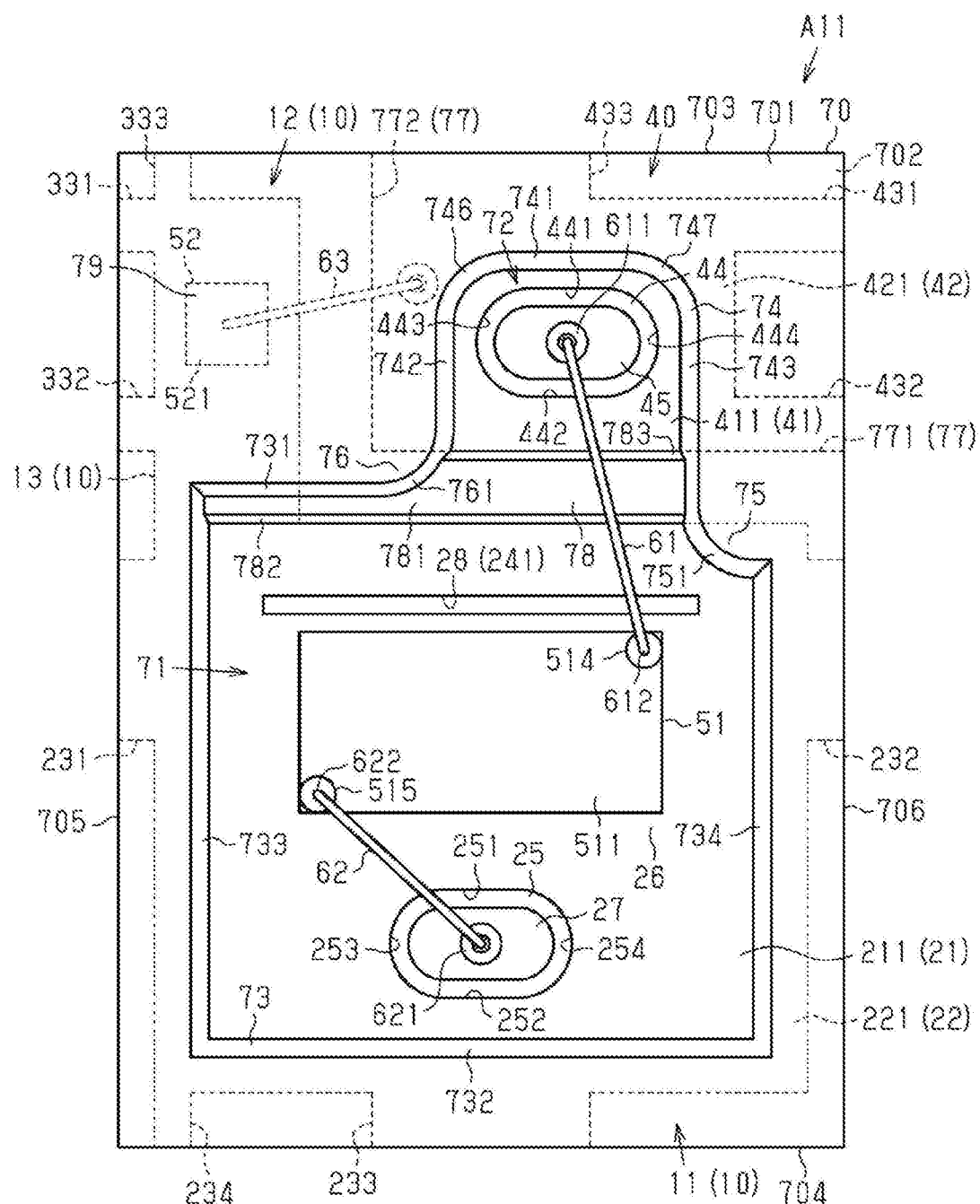
FIG. 21 is a schematic plan view of a semiconductor light-emitting device according to a modification.

In the main lead 10, the shape of the groove 24 may be changed as appropriate. As shown in FIG. 21, the main lead 10 of a semiconductor light-emitting device A11 includes a line of groove 28 (groove portion 241) extending in the second direction between the die bonding portion 26 and the wall portion 78. The semiconductor light-emitting device A11 shown in FIG. 21 may be configured to include the groove 28 and at least one selected from the group of the groove portions 242, 243, and 244 forming the groove 24 shown in FIG. 1.

Figure 22:
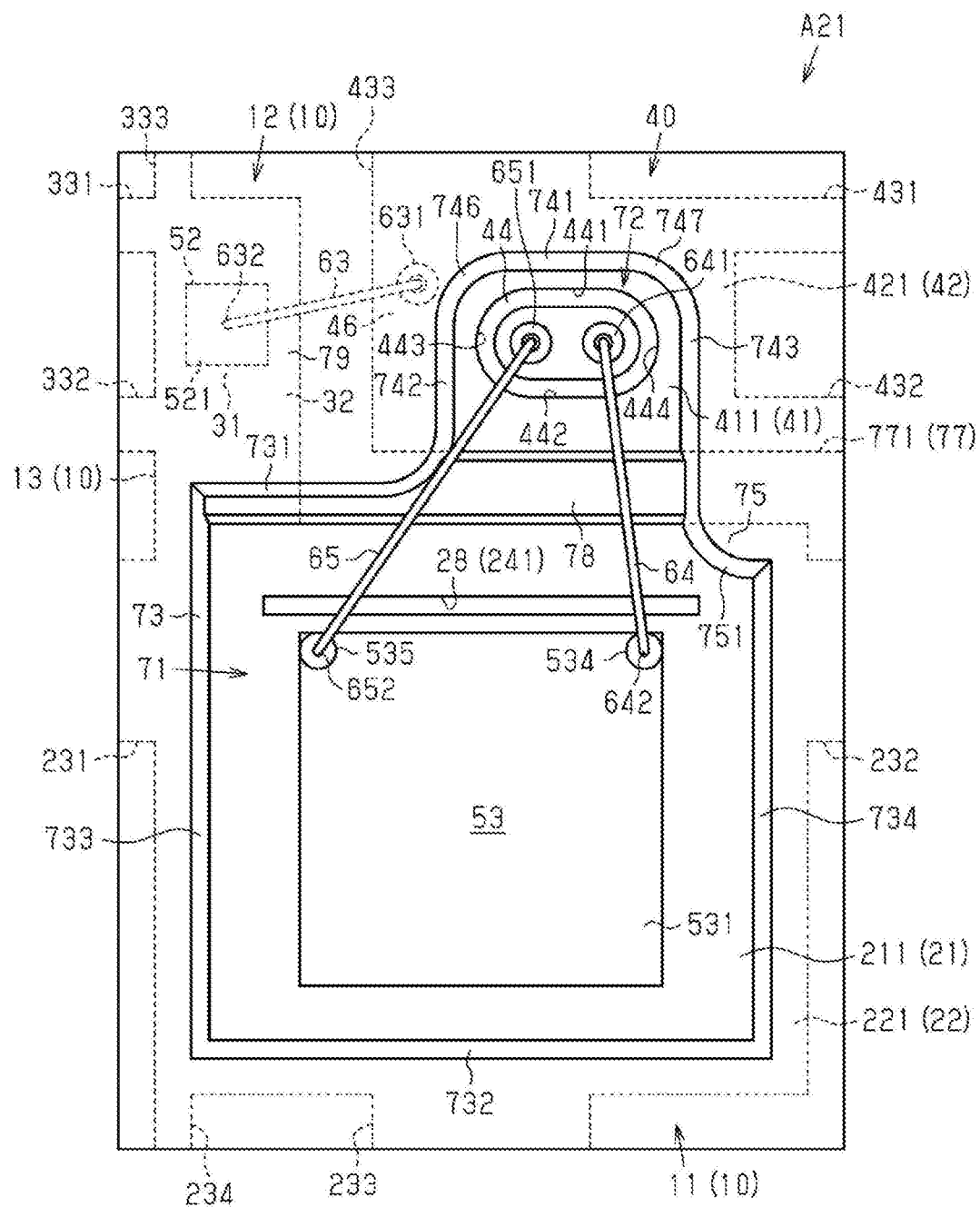
FIG. 22 is a schematic plan view of a semiconductor light-emitting device according to a modification.

As shown in FIG. 22, the main lead 10 of a semiconductor light-emitting device A21 includes a line of groove 28 (groove portion 241) extending in the second direction between the die bonding portion 26 and the wall portion 78. The semiconductor light-emitting device A21 shown in FIG. 22 may be configured to include the groove 28 and at least one selected from the group of the groove portions 242, 243, and 244 forming the groove 24 shown in FIG. 17.

In each of the above-described embodiments, the grooves 24, 25, and 44 are annular, but they may be discontinuous. For example, in the groove 24 of the semiconductor light-emitting device A10 of the first embodiment, at least one set of the groove portions 241 and 243, the groove portions 241 and 244, the groove portions 242 and 243, and the groove portions 242 and 244 may not communicate with each other. Moreover, each of the groove portions 241, 242, 243, and 244 may be discontinuous.

Figure 23:
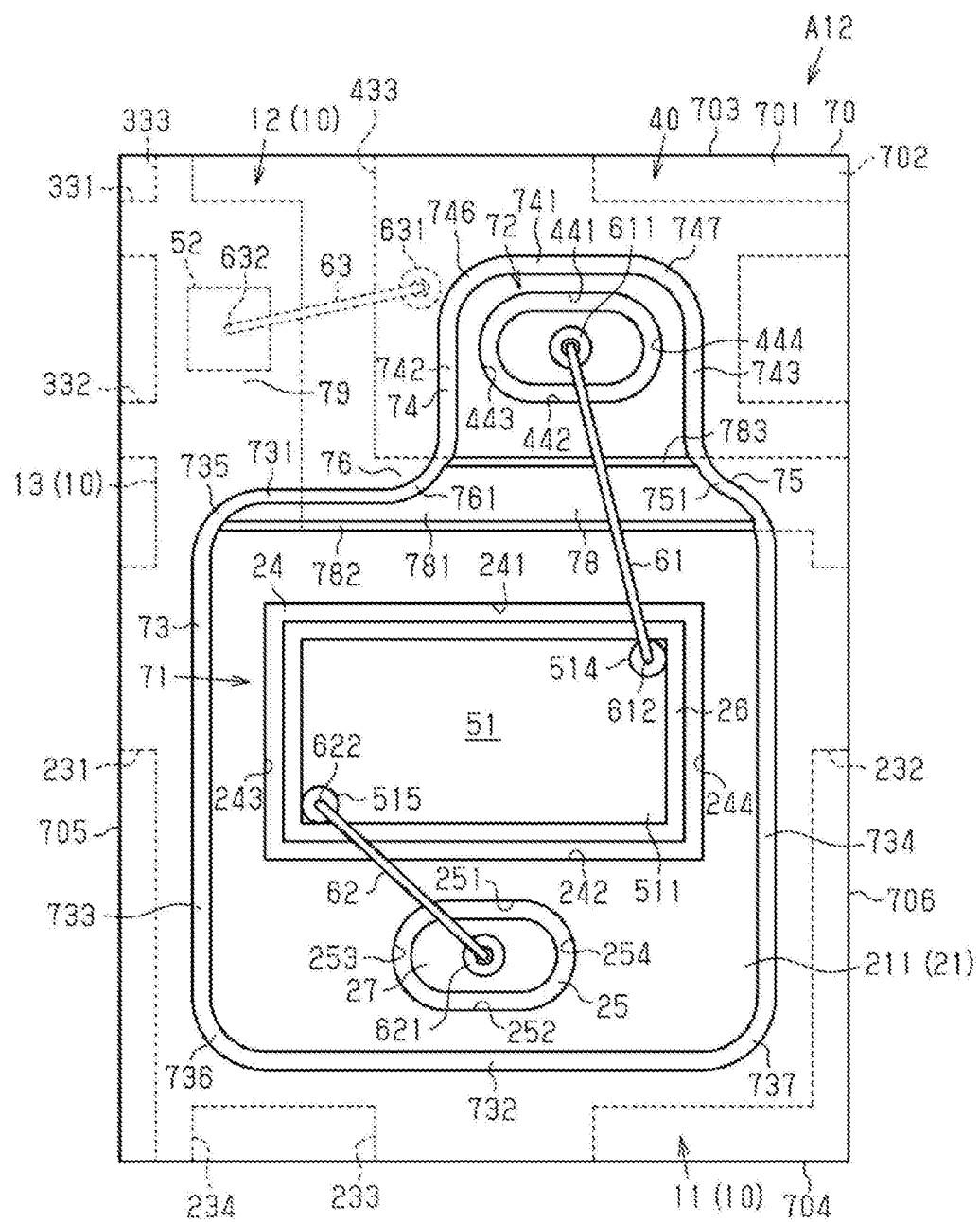
FIG. 23 is a schematic plan view of a semiconductor light-emitting device according to a modification.

The shapes of the main opening 71 and the sub opening 72 may be changed as appropriate. As shown in FIG. 23, a semiconductor light-emitting device A12 includes a main opening 71 and a sub opening 72. The main opening 71 has a rectangular shape with rounded corners.

The case 70 includes a main inner side surface 73 that defines the main opening 71. The main inner side surface 73 includes a first main inner side surface 731, a second main inner side surface 732, a third main inner side surface 733, a fourth main inner side surface 734, and connecting surfaces 735, 736, and 737 therebetween. Each of the connecting surfaces 735, 736, and 737 has a quarter annular shape when viewed in the thickness direction z. The connecting surface 735 connects the first main inner side surface 731 and the third main inner side surface 733. The connecting surface 736 connects the second main inner side surface 732 and the third main inner side surface 733. The connecting surface 737 connects the second main inner side surface 732 and the fourth main inner side surface 734. Each of the connecting surfaces 735, 736, and 737 is inclined so as to move away from the die bonding portion 26 in a direction orthogonal to the thickness direction z, that is, move away from the semiconductor light-emitting element 51, from the main surface 101 side of the main lead 10 toward the case main surface 701 of the case 70.

In the semiconductor light-emitting device A12, the third main inner side surface 733 and the fourth main inner side surface 734 of the case 70 have substantially the same length in the first direction y. The connecting portion 75 that connects the third sub inner side surface 743 and the fourth main inner side surface 734 is formed on the wall portion 78.

In the semiconductor light-emitting device A12 including the main opening 71 having such a shape, even if the semiconductor light-emitting device A12 includes the quarter annular connecting surfaces 735 to 737, a region exposed in the main lead 10 can be secured by the main opening 71 so as to be able to mount a large semiconductor light-emitting device.

Figure 24:
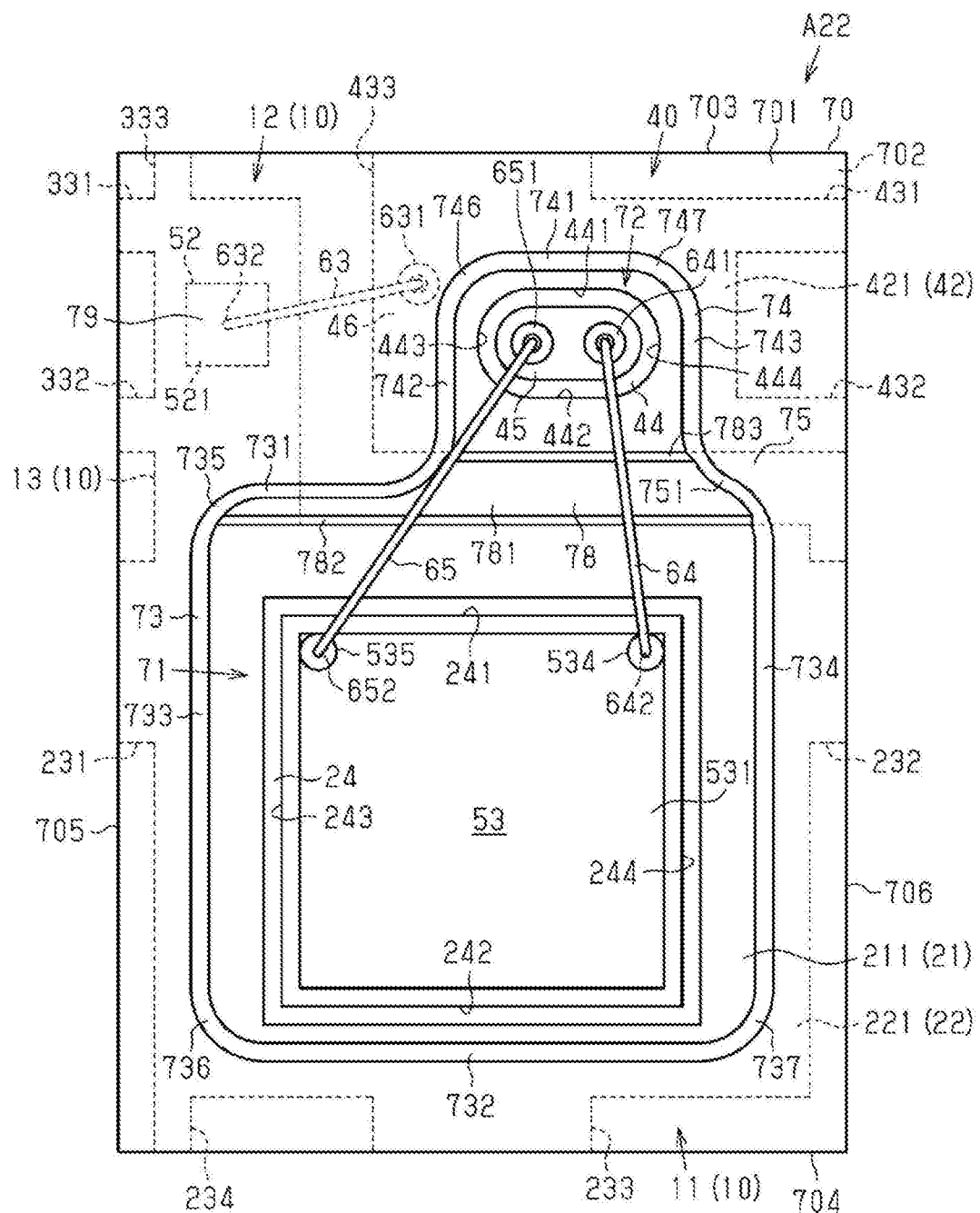
FIG. 24 is a schematic plan view of a semiconductor light-emitting device according to a modification.

As shown in FIG. 24, a semiconductor light-emitting device A22 includes a main opening 71 and a sub opening 72. The main opening 71 has a rectangular shape with rounded corners. The main opening 71 has the same structure as that in the semiconductor light-emitting device A12 shown in FIG. 23. Accordingly, even in this semiconductor light-emitting device A22, a region exposed in the main lead 10 can be secured by the main opening 71 so as to be able to mount a large semiconductor light-emitting device.

The protective element 52 and the wire 63 may be omitted in the semiconductor light-emitting device A10 of the first embodiment and the semiconductor light-emitting device A20 of the second embodiment. In the semiconductor light-emitting device A10 of the first embodiment and the semiconductor light-emitting device A20 of the second embodiment, the protective element 52 may be exposed from the case 70. For example, the protective element 52 is arranged in the main opening 71 or the sub opening 72.

<Aspects of Present Disclosure>

Hereinafter, some aspects of the present disclosure will be additionally described as supplementary notes.

(Supplementary Note 1)

According to one aspect of the present disclosure, a semiconductor light-emitting device includes: a main lead including a main surface; a semiconductor light-emitting element mounted on the main surface of the main lead; a bonding material that bonds the semiconductor light-emitting element to the main surface of the main lead; a sub lead arranged in a first direction with respect to the main lead and including a main surface facing the same side as the main surface of the main lead; a first wire including a first end connected to the main surface of the sub lead and a second end connected to the semiconductor light-emitting element; a resin case including a case main surface facing the same direction as the main surfaces of the main lead and the sub lead and supporting the main lead and the sub lead, wherein the resin case includes: a main opening that is partitioned by a main inner side surface facing the semiconductor light-emitting element and exposes a portion of the main surface of the main lead and the semiconductor light-emitting element; a sub opening that extends in the first direction from a first main inner side surface of the main inner side surface facing an opposite side of the sub lead and exposes a portion of the main surface of the sub lead and the first end of the first wire; and a wall portion that is arranged between the main lead and the sub lead, extends along a second direction orthogonal to the first direction and parallel to the main surface of the main lead, protrudes from the main surface of the main lead and the main surface of the sub lead toward the case main surface side, and includes an upper surface located between the case main surface and the main surfaces of the main lead and the sub lead, and wherein the first main inner side surface extends from the upper surface of the wall portion to the case main surface of the resin case.

(Supplementary Note 2)

The semiconductor light-emitting device of Supplementary Note 1, further includes: a protective element mounted on the main lead; a bonding material that bonds the protective element to the main lead; and a third wire that connects the protective element and the sub lead.

(Supplementary Note 3)

In the semiconductor light-emitting device of Supplementary Note 2, the main lead includes a first element mounting portion on which the semiconductor light-emitting element is mounted, and a second element mounting portion on which the protective element is mounted, and the sub lead includes a second wire bonding portion to which the third wire is connected.

(Supplementary Note 4)

In the semiconductor light-emitting device of Supplementary Note 3, the second element mounting portion is arranged side by side with the sub lead in the second direction.

(Supplementary Note 5)

In the semiconductor light-emitting device of Supplementary Note 3, the second wire bonding portion is provided at a second main body portion of the sub lead.

(Supplementary Note 6)

In the semiconductor light-emitting device of Supplementary Note 3, the second element mounting portion includes a main surface and a back surface and includes a third main body portion having the same thickness as a first main body portion of the main lead and a third edge portion that is thinner than the third main body portion and is connected to the third main body portion.

(Supplementary Note 7)

In the semiconductor light-emitting device of Supplementary Note 6, the back surface of the third main body portion is exposed from a case back surface of the resin case.

(Supplementary Note 8)

In the semiconductor light-emitting device of Supplementary Note 3, the main lead includes a connecting portion that connects the first element mounting portion and the second element mounting portion.

(Supplementary Note 9)

In the semiconductor light-emitting device of Supplementary Note 3, the resin case includes a sealing portion that seals the protective element, the third wire, and the second wire bonding portion of the sub lead.

(Supplementary Note 10)

In the semiconductor light-emitting device of Supplementary Note 1, the main lead includes: a first extension portion extending to a first case outer side surface of the resin case in the first direction; and a second extension portion extending to a second case outer side surface of the resin case in the second direction, and wherein the sub lead includes: a third extension portion extending to a third case outer side surface of the resin case and provided at a position overlapping the first extension portion in the first direction; and a fourth extension portion extending to a fourth case outer side surface of the resin case and provided at a position overlapping the second extension portion in the second direction.

(Supplementary Note 11)

In the semiconductor light-emitting device of Supplementary Note 10, the main lead includes a fifth extension portion extending from one end portion in the first direction in a direction different from the first direction and the second direction, and the sub lead includes a sixth extension portion that is parallel with the fifth extension portion and extends in a direction opposite to the direction in which the fifth extension portion extends, from an end portion of the main lead opposite to the one end portion.

According to the present disclosure in some embodiments, it is possible to provide a semiconductor light-emitting device capable of suppressing the spread of a bonding material.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor light-emitting device comprising:
   a main lead including a main surface;
   a semiconductor light-emitting element mounted on the main surface of the main lead;
   a bonding material that bonds the semiconductor light-emitting element to the main surface of the main lead;
   a sub lead arranged in a first direction with respect to the main lead and including a main surface facing the same side as the main surface of the main lead;
   a first wire including a first end connected to the main surface of the sub lead and a second end connected to the semiconductor light-emitting element;
   a resin case including a case main surface facing the same direction as the main surfaces of the main lead and the sub lead and supporting the main lead and the sub lead, wherein the resin case includes:
      a main opening that is partitioned by a main inner side surface facing the semiconductor light-emitting element and exposes a portion of the main surface of the main lead and the semiconductor light-emitting element;
      a sub opening that extends in the first direction from a first main inner side surface of the main inner side surface facing an opposite side of the sub lead and exposes a portion of the main surface of the sub lead and the first end of the first wire; and
      a wall portion that is arranged between the main lead and the sub lead, extends along a second direction orthogonal to the first direction and parallel to the main surface of the main lead, protrudes from the main surface of the main lead and the main surface of the sub lead toward the case main surface side, and includes an upper surface located between the case main surface and the main surfaces of the main lead and the sub lead, and
   wherein the first main inner side surface extends from the upper surface of the wall portion to the case main surface of the resin case.

2. The semiconductor light-emitting device of claim 1, wherein the main lead includes:
   a first main body portion including a main surface and a back surface facing opposite to each other, the main surface of the first main body portion including a die bonding portion on which the semiconductor light-emitting element is mounted; and
   a first edge portion including a main surface and a back surface facing opposite to each other, extending from the first main body portion, and being thinner than the first main body portion, the main surface of the first edge portion being flush with the main surface of the first main body portion.

3. The semiconductor light-emitting device of claim 2, wherein the sub lead includes:
   a second main body portion including a main surface and a back surface facing opposite to each other, the main surface of the second main body portion including a first wire bonding portion to which the first wire is connected; and
   a second edge portion including a main surface and a back surface facing opposite to each other, extending from the second main body portion, and being thinner than the second main body portion, the main surface of the second edge portion being flush with the main surface of the second main body portion.

4. The semiconductor light-emitting device of claim 3, wherein the resin case includes a case back surface facing an opposite side of the case main surface,
   wherein the first main body portion includes the back surface facing an opposite side of the main surface of the first main body portion, and
   wherein the back surface of the first main body portion is exposed from the case back surface.

5. The semiconductor light-emitting device of claim 4, wherein the back surface of the first main body portion is flush with the case back surface.

6. The semiconductor light-emitting device of claim 4, wherein the second main body portion includes the back surface facing an opposite side of the main surface of the second main body portion, and
   wherein the back surface of the second main body portion is exposed from the case back surface.

7. The semiconductor light-emitting device of claim 6, wherein the back surface of the second main body portion is flush with the case back surface.

8. The semiconductor light-emitting device of claim 4, wherein the main inner side surface includes:
   a second main inner side surface facing an opposite side of the first main inner side surface; and
   a third main inner side surface and a fourth main inner side surface that are orthogonal to the first main inner side surface and the second main inner side surface and face opposite sides, and
   wherein, in the second main inner side surface, the third main inner side surface, and the fourth main inner side surface, an end portion that is in contact with the main surface of the first main body portion is located inside the first main body portion closer than an end portion of the first main body portion.

9. The semiconductor light-emitting device of claim 3, wherein an end portion of the sub inner side surface partitioning the sub opening on the second main body portion side is located inside the second main body portion closer than an end portion of the second main body portion.

10. The semiconductor light-emitting device of claim 1, wherein the main inner side surface of the main opening is inclined so as to move away from the semiconductor light-emitting element in a direction orthogonal to a thickness direction from the main lead toward the case main surface.

11. The semiconductor light-emitting device of claim 1, wherein a sub inner side surface of the sub opening is inclined so as to move away from the first end of the first wire from the sub lead toward the case main surface.

12. The semiconductor light-emitting device of claim 1, wherein in the wall portion, a wall surface on the main opening side is inclined so as to move away from the semiconductor light-emitting element in the first direction from the main lead toward the upper surface of the wall portion, and
wherein in the wall portion, a wall surface on the sub opening side is inclined so as to move away from the first end of the first wire in the first direction from the sub lead toward the upper surface of the wall portion.

13. The semiconductor light-emitting device of claim 1, wherein the resin case is made of white synthetic resin.

14. The semiconductor light-emitting device of claim 2, wherein the semiconductor light-emitting element includes a second electrode on a main surface of the semiconductor light-emitting element,
wherein the first main body portion includes a wire bonding portion, and
wherein the semiconductor light-emitting device includes a second wire that connects the semiconductor light-emitting element and the wire bonding portion.

15. The semiconductor light-emitting device of claim 14, wherein the wire bonding portion is provided at the opposite side of the sub lead with respect to the die bonding portion in the first direction.

16. The semiconductor light-emitting device of claim 14, wherein the first main body portion includes a third groove surrounding the wire bonding portion.

17. The semiconductor light-emitting device of claim 15, wherein the main lead includes a first groove recessed from the main surface of the main lead between the die bonding portion and the wall portion.

18. The semiconductor light-emitting device of claim 17, wherein the first groove is formed in an annular shape so as to surround the die bonding portion.

19. The semiconductor light-emitting device of claim 14, wherein the sub lead includes a second groove recessed from the main surface of the sub lead between a first wire bonding portion and the wall portion.

20. The semiconductor light-emitting device of claim 19, wherein the second groove is formed in an annular shape so as to surround the first wire bonding portion.

* * * * *